United States Patent
Nishikido

(10) Patent No.: US 12,556,168 B2
(45) Date of Patent: Feb. 17, 2026

(54) SEMICONDUCTOR INTEGRATED CIRCUIT AND SEMICONDUCTOR DEVICE

(71) Applicant: Mitsubishi Electric Corporation, Tokyo (JP)

(72) Inventor: Osamu Nishikido, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 158 days.

(21) Appl. No.: 18/551,014

(22) PCT Filed: Apr. 13, 2021

(86) PCT No.: PCT/JP2021/015331
§ 371 (c)(1),
(2) Date: Sep. 18, 2023

(87) PCT Pub. No.: WO2022/219720
PCT Pub. Date: Oct. 20, 2022

(65) Prior Publication Data
US 2024/0162894 A1    May 16, 2024

(51) Int. Cl.
*H03K 3/356* (2006.01)
*H03K 3/014* (2006.01)
(Continued)

(52) U.S. Cl.
CPC ....... *H03K 3/356043* (2013.01); *H03K 3/014* (2013.01); *H03K 3/0375* (2013.01); *H03K 19/1733* (2013.01)

(58) Field of Classification Search
CPC ............. H03K 3/356043; H03K 3/014; H03K 3/0375; H03K 19/1733
See application file for complete search history.

(56) References Cited

U.S. PATENT DOCUMENTS

| | | | |
|---|---|---|---|
| 2005/0259764 A1* | 11/2005 | Hung Lai | H03K 3/356043 375/317 |
| 2016/0003914 A1* | 1/2016 | Allen | G01R 31/52 324/523 |
| 2019/0101584 A1* | 4/2019 | Niemeyer | G01R 19/252 |

FOREIGN PATENT DOCUMENTS

| | | |
|---|---|---|
| JP | H0737956 A | 2/1995 |
| JP | H09101347 A | 4/1997 |

(Continued)

OTHER PUBLICATIONS

International Search Report (PCT/ISA/210) with English translation and Written Opinion (PCT/ISA/237) mailed on Jun. 22, 2021, by the Japanese Patent Office as the International Searching Authority for International Application No. PCT/JP2021/015331.

*Primary Examiner* — Lincoln D Donovan
*Assistant Examiner* — James G Yeaman
(74) *Attorney, Agent, or Firm* — Buchanan Ingersoll & Rooney PC

(57) ABSTRACT

In a semiconductor integrated circuit, a first analog circuit block operates by a voltage applied between a first node and a third node. Each of a plurality of first current sources has a first end connected to the third node and a second end connected to the first analog circuit block. The plurality of first current sources function as current sourcing or current sinking for the first analog circuit block. A first switch group is provided between the plurality of first current sources and the first analog circuit block, and in a test mode, individually switches electrical connection of the second end of each of the plurality of first current sources from the first analog circuit block to a second node.

15 Claims, 17 Drawing Sheets

(51) Int. Cl.
*H03K 3/037* (2006.01)
*H03K 19/173* (2006.01)

(56) References Cited

FOREIGN PATENT DOCUMENTS

| | | |
|---|---|---|
| JP | 2007178345 A | 7/2007 |
| JP | 2009085877 A | 4/2009 |

* cited by examiner

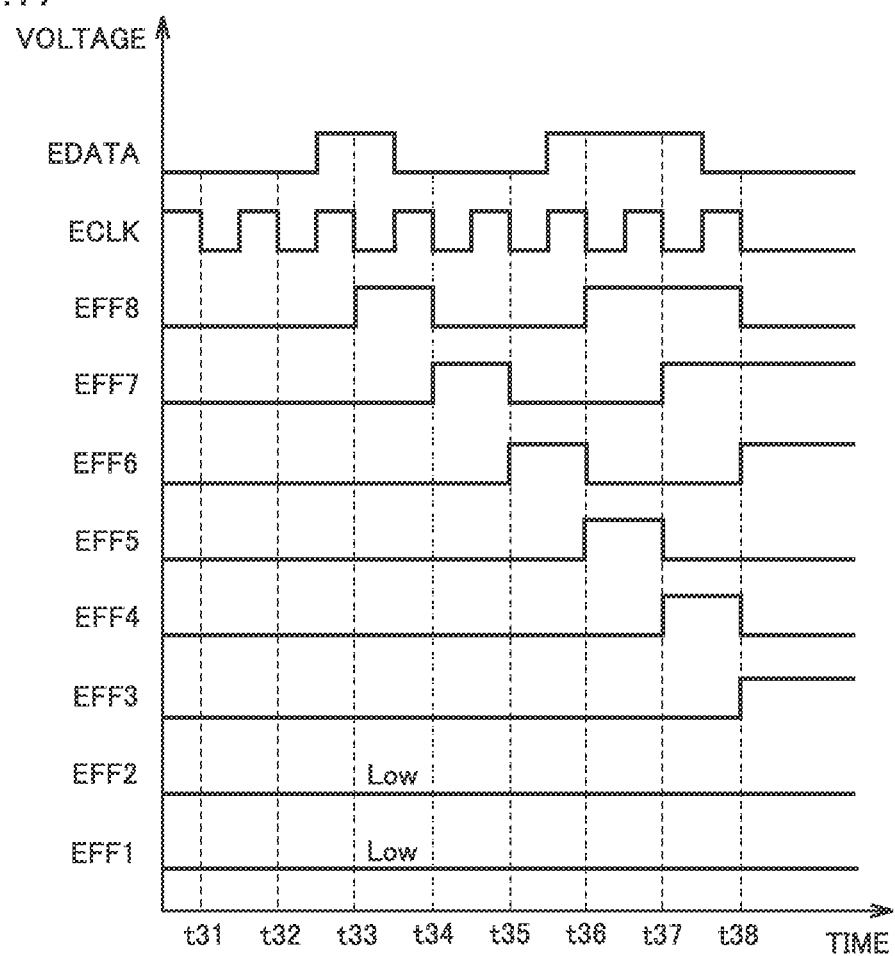

SEMICONDUCTOR INTEGRATED CIRCUIT AND SEMICONDUCTOR DEVICE

TECHNICAL FIELD

The present disclosure relates to a semiconductor integrated circuit and a semiconductor device.

BACKGROUND ART

When a market defect of a semiconductor integrated circuit is generated, it is difficult to specify where a failure is generated, and a failure analysis time is often enormous. This problem becomes notable as the semiconductor integrated circuit becomes more complicated and larger in scale.

PTL 1 (Japanese Patent Laying-Open No. 2007-178345) discloses a technique of more accurately specifying a failure generation portion in the semiconductor integrated circuit including an analog circuit. Specifically, the semiconductor integrated circuit of this document includes a control circuit that turns on and off current supply for each circuit unit provided for each function of the analog circuit. In a test mode in which current consumption of the entire semiconductor integrated circuit is measured from an outside, the control circuit turns on and off the current supply for each small block that is finer than the circuit unit.

PTL 2 (Japanese Patent Laying-Open No. 2009-085877) discloses a technique of enabling measurement of the current consumption for each central processing unit (CPU) block in a large scale integration (LSI) with an externally-connected measurement circuit. Specifically, when measuring the current consumption, the CPU accesses a register and sets in the register a control content for connecting a power input terminal of the CPU block to be measured to the power supply terminal dedicated to current measurement. A selector connected to the CPU block to be measured switches a power supply line of the CPU block to be measured from the normal power supply line to the power supply line for current consumption measurement in accordance with the control content set in the register.

CITATION LIST

Patent Literature

PTL 1: Japanese Patent Laying-Open No. 2007-178345
PTL 2: Japanese Patent Laying-Open No. 2009-085877

SUMMARY OF INVENTION

Technical Problem

Current sources are often used in analog circuits, and if the current generated by the current sources deviates from a desired value, the characteristics of the analog circuits are likely to deteriorate. However, because it is difficult to externally measure the value of the current generated by an individual current source, it is difficult to identify a failed current source. According to the techniques disclosed in PTLs 1, 2 described above, it is possible to detect an abnormality of the current consumption for each circuit block, but it is difficult to detect whether the generated current of each current source is abnormal.

The present disclosure has been made in view of the above problems, and an object of the present disclosure is to provide a semiconductor integrated circuit capable of individually measuring the generated current of each current source.

Solution to Problem

A semiconductor integrated circuit according to an embodiment includes a first node, a second node, a third node, a first analog circuit block, a plurality of first current sources, and a first switch group. The first analog circuit block operates by voltage applied between the first node and the third node. Each of the plurality of first current sources has a first end connected to the third node and a second end connected to the first analog circuit block. The plurality of first current sources function as current sourcing or current sinking for the first analog circuit block. The first switch group is provided between the plurality of first current sources and the first analog circuit block, and in a test mode, individually switches electrical connection of the second end of each of the plurality of first current sources from the first analog circuit block to the second node.

Advantageous Effects of Invention

According to the semiconductor integrated circuit described above, current generated by each first current source can be individually measured in the test mode by individually switching the electrical connection of the second end of each of the plurality of first current sources from the first analog circuit block to the second node.

BRIEF DESCRIPTION OF DRAWINGS

FIG. 17 is a timing chart illustrating a procedure for transferring error data to a D flip-flop configuring a second switch group in FIG. 16.

DESCRIPTION OF EMBODIMENTS

Figure 1:
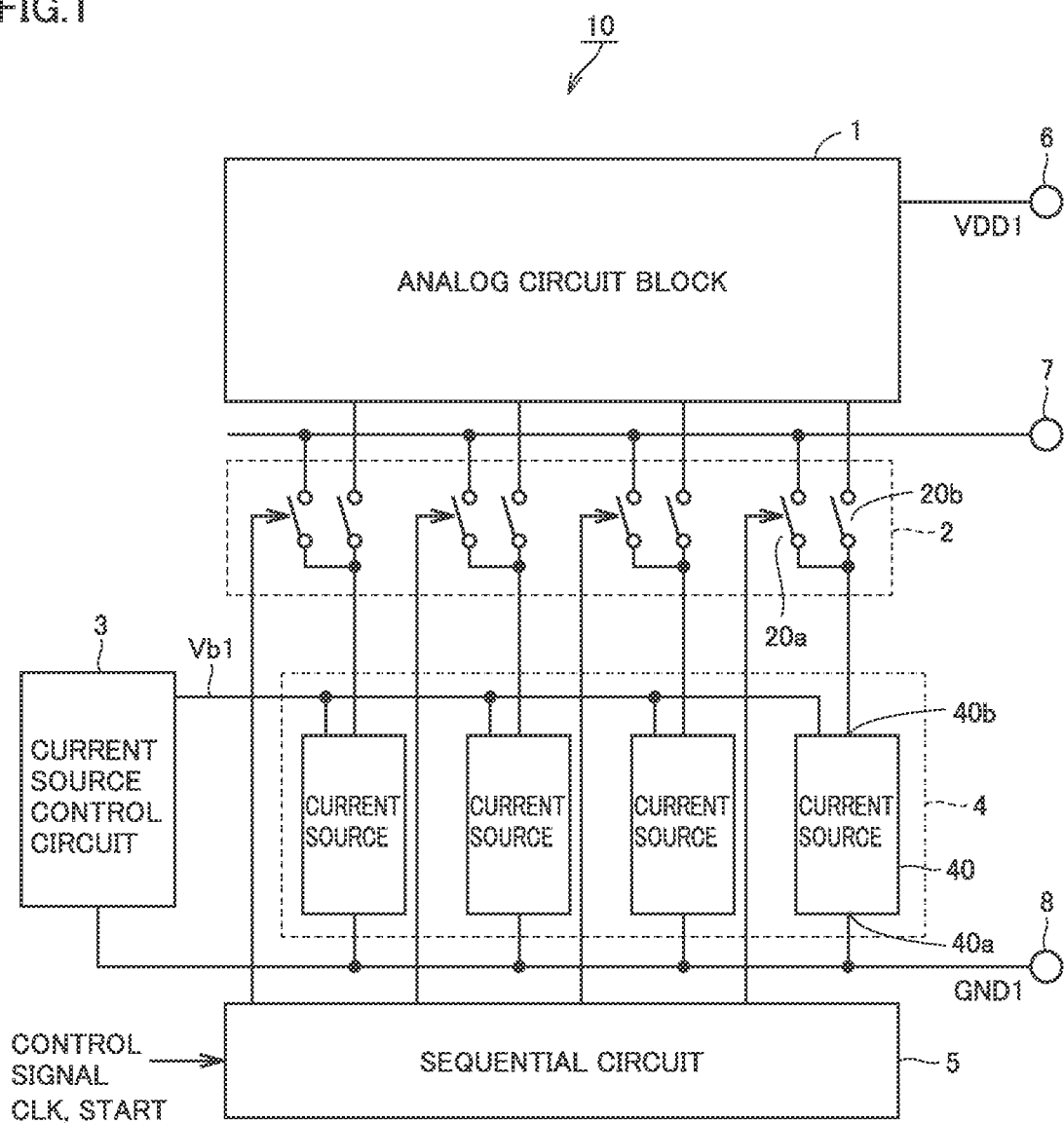
FIG. 1 is a block diagram illustrating a schematic configuration of a semiconductor integrated circuit according to a first embodiment.

With reference to the drawings, each embodiment will be described in detail below. The same or corresponding component is denoted by the same reference numeral, and the description thereof will not be repeated.

First Embodiment

[Schematic Configuration of Semiconductor Integrated Circuit]

FIG. 1 is a block diagram illustrating a schematic configuration of a semiconductor integrated circuit according to a first embodiment. With reference to FIG. 1, a semiconductor integrated circuit 10 includes an analog circuit block 1, a switch group 2, a current source control circuit 3, a current source group 4, a sequential circuit 5, power supply nodes (nodes) 6, 7, and a ground node 8.

A power supply voltage VDD1 is supplied to power supply node 6, and a reference potential GND1 is supplied to ground node 8. Analog circuit block 1 is an analog circuit that is operated by power supply voltage VDD1 applied between power supply node 6 and ground node 8.

Current source group 4 includes a plurality of current sources 40. In FIG. 1, four current sources 40 are representatively illustrated, but the number of current sources 40 is not limited to four. Magnitude of the current generated by each of the plurality of current sources 40 is controlled by a bias voltage Vb1 supplied from current source control circuit 3. A first end 40a of each of the plurality of current sources 40 is connected to ground node 8, and a second end 40b of each of the plurality of current sources is connected to analog circuit block 1 with switch group 2 interposed therebetween. The plurality of current sources 40 function as current sinking for analog circuit block 1.

Switch group 2 includes a large number of switches. In a normal mode, switch group 2 electrically connects second end 40b of each current source 40 configuring current source group 4 to analog circuit block 1. In a test mode, switch group 2 individually and selectively switches the electrical connection of second end 40b of each of the plurality of current sources 40 configuring current source group 4 from analog circuit block 1 to power supply node 7. Thus, the current flowing from the outside of semiconductor integrated circuit 10 to each current source 40 configuring current source group 4 can be individually measured through power supply node 7.

Specifically, in the example of FIG. 1, switch group 2 includes two switches 20a, 20b corresponding to each current source 40. Second end 40b of each current source 40 is connected to power supply node 7 with corresponding switch 20a interposed therebetween, and is connected to analog circuit block 1 with corresponding switch 20b interposed therebetween.

Sequential circuit 5 controls switch group 2 in response to a control signal. In the case of the first embodiment, sequential circuit 5 is a synchronous sequential circuit that operates in synchronization with a clock signal CLK. In response to a control signal (for example, a test start pulse START) in the test mode, sequential circuit 5 electrically connects second ends 40b of the plurality of current sources 40 configuring current source group 4 to power supply node 7 one by one in order. Thus, the current flowing from the outside of semiconductor integrated circuit 10 to each of the plurality of current sources 40 configuring current source group 4 can be sequentially measured one by one through power supply node 7.

[Specific Configuration Example of Semiconductor Integrated Circuit 10]

Figure 2:
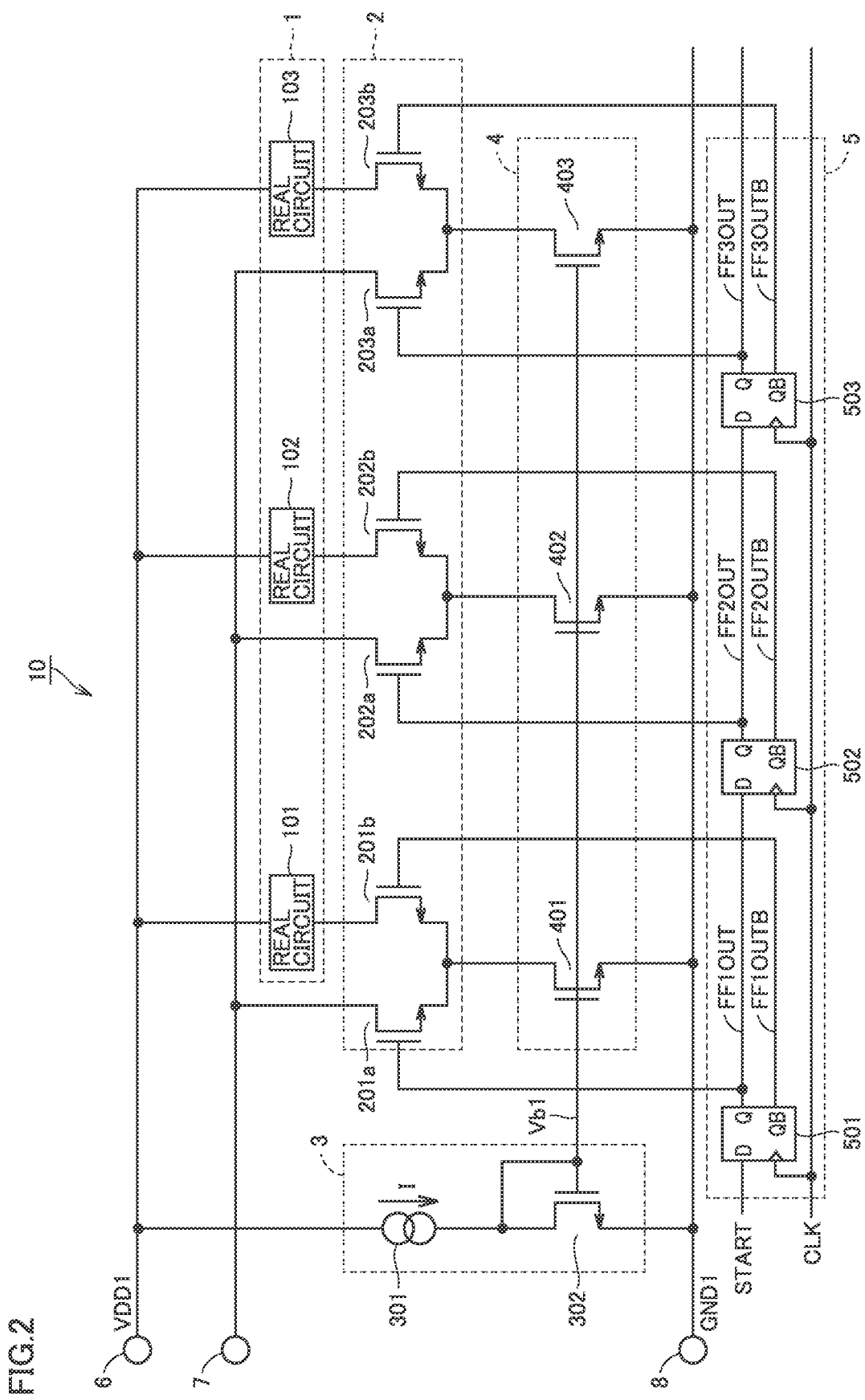
FIG. 2 is a circuit diagram illustrating a specific configuration example of the semiconductor integrated circuit in FIG. 1.

FIG. 2 is a circuit diagram illustrating a specific configuration example of the semiconductor integrated circuit in FIG. 1. FIG. 2 illustrates specific configuration examples of current source group 4, current source control circuit 3, switch group 2, and sequential circuit 5 in FIG. 1. In FIG. 2, analog circuit block 1 is divided into real circuits 101, 102, 103 in association with NMOS transistors 401, 402, 403 used for current sources.

As illustrated in FIG. 2, current source group 4 includes a plurality of negative-channel metal oxide semiconductor (NMOS) transistors 401, 402, 403 as the plurality of current sources 40. A source of each of NMOS transistors 401 to 403 is connected to ground node 8 as first end 40a of current source 40. Each of NMOS transistors 401 to 403 functions as current sinking that absorbs the current through a drain (corresponding to second end 40b of current source 40). In FIG. 2, three NMOS transistors 401 to 403 used for current sources are representatively illustrated, but the number of NMOS transistors 401 to 403 for power source is not limited to three.

Another type of transistor such as a bipolar transistor may be used instead of the MOS transistor. Similarly, a type of the transistor is not particularly limited in other circuits of the present disclosure.

Current source control circuit 3 includes a reference current source 301 and an NMOS transistor 302 as a reference transistor which are connected in series between power supply node 6 and ground node 8. The source of NMOS transistor 302 is connected to ground node 8. The drain of the NMOS transistor 302 receives input of current I from reference current source 301.

A gate and the drain of NMOS transistor 302 are connected to each other. That is, NMOS transistor 302 is diode-connected. Thus, the voltage corresponding to current I of reference current source 301 is generated between the gate and the source of NMOS transistor 302. Furthermore, the gate of NMOS transistor 302 is connected to each gate of NMOS transistors 401 to 403 configuring current source group 4, and the source of NMOS transistor 302 is connected to each source of NMOS transistors 401 to 403. Therefore, a gate-source voltage of each of NMOS transistors 401 to 403 is equal to a gate-source voltage of NMOS transistor 302. Thus, NMOS transistor 302 and NMOS transistors 401 to 403 form what is called a current mirror. Current source control circuit 3 supplies bias voltage Vb1 to the gates of NMOS transistors 401 to 403.

Switch group 2 includes a plurality of sets of switching NMOS transistors (201a, 201b) to (203a, 203b), each set being provided for a corresponding one of the plurality of NMOS transistors 401 to 403 configuring current source group 4. For example, NMOS transistors 201a, 201b correspond to switches 20a, 20b in FIG. 1, respectively.

The source of each of NMOS transistors 201a, 201b is connected to the drain of corresponding NMOS transistor 401 (that is, second end 40b of corresponding current source 40). The drain of NMOS transistor 201a is connected to power supply node 7. The drain of NMOS transistor 201b is connected to real circuit 101 configuring analog circuit block 1. A gate control signal controlling on and off of NMOS transistors 201a, 201b is input to the gate of each of NMOS transistors 201a, 201b from sequential circuit 5. The same applies to NMOS transistors 202a, 202b and NMOS transistors 203a, 203b.

Sequential circuit 5 includes a plurality of D flip-flops 501 to 503 connected in cascade, and has a circuit configuration similar to that of a shift register. D flip-flops 501 to 503 correspond to current source NMOS transistors 401 to 403, respectively. Each of D flip-flops 501 to 503 controls a corresponding one of the sets of switching NMOS transistors (201a, 201b) to (203a, 203b), which is connected to the corresponding current source NMOS transistor according to an internal state (that is, a set state or a reset state).

More specifically, first to N-th D flip-flops respectively corresponding to first to N-th current source NMOS transitory are provided in sequential circuit 5. The N D flip-flops are cascade-connected. That is, an output terminal (Q terminal) of the i-th ($1 \le i \le N-1$) D flip-flop is connected to an input terminal (D terminal) of the (i+1)-th D flip-flop. The drain of each of the N current source NMOS transistors is connected to the sources of the first and second switching NMOS transistors. Thus, the drain of each of the current source NMOS transistors is connected to power supply node 7 with the first switching NMOS transistor interposed therebetween, and connected to analog circuit block 1 with the second switching NMOS transistor interposed therebetween. The Q terminal of each of the N D flip-flops is connected to the gate of the first switching NMOS transistor that is connected to the corresponding current source NMOS transistor. An inverting output terminal (QB terminal) of each of the N D flip-flops is connected to the gate of the second switching NMOS transistor that is connected to the corresponding current source NMOS transistor.

In sequential circuit 5 having the above configuration, when a test start pulse STRAT is input to the D terminal of the first D flip-flop, the first D flip-flop is set. Thereafter, in synchronization with the clock signal, test start pulse STRAT is sequentially transferred from the first D flip-flop to the N-th D flip-flop. That is, the N D flip-flops sequentially go one by one from the reset state to the set state and then go back to the reset state. When a j-th ($1 \le j \le N$) D flip-flop is in the set state, the first switching NMOS transistor connected to the corresponding j-th current source NMOS transistor is in a conductive state (also referred to as an on state), and the second switching NMOS transistor is in a non-conductive state (also referred to as an off state). Thus, the source of the j-th current source NMOS transistor and power supply node 7 are brought into conduction, and therefore the current flowing through the j-th current source NMOS transistor can be measured from the outside of semiconductor integrated circuit 10 through power supply node 7.

[Operation of Sequential Circuit]

Figure 3:
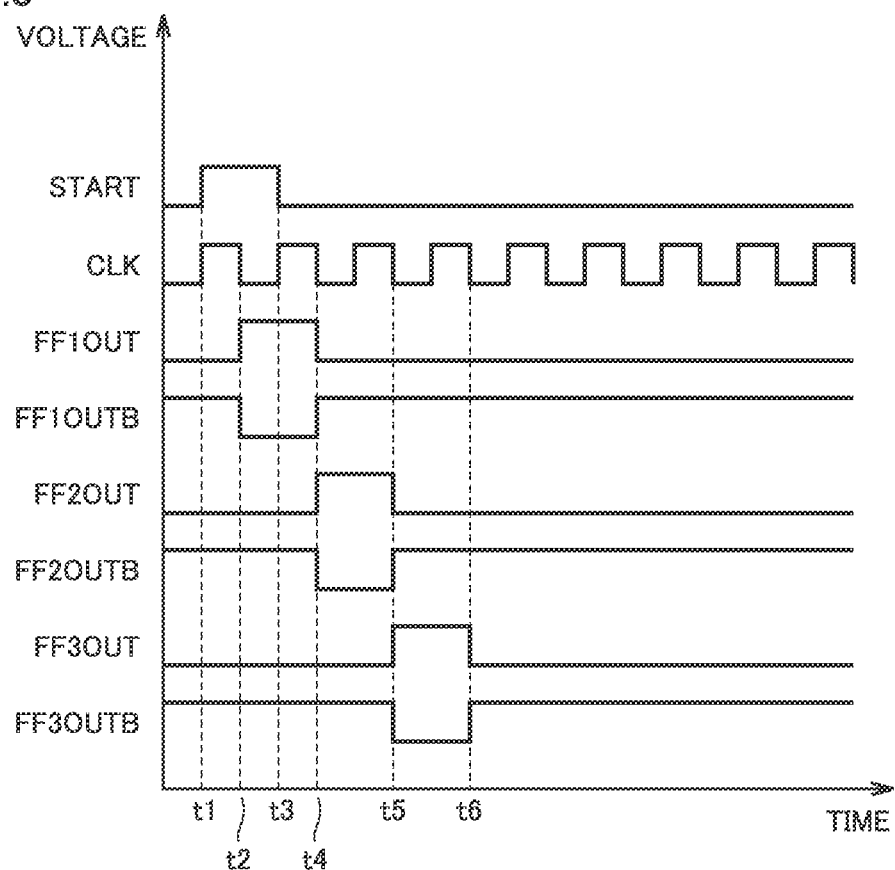
FIG. 3 is a timing chart illustrating operation of a sequential circuit in FIG. 2.

FIG. 3 is a timing chart illustrating operation of the sequential circuit in FIG. 2. With reference to FIGS. 2 and 3, the operation of sequential circuit 5 will be described below. In the following description, it is assumed that each of D flip-flops 501 to 503 transfers the state of the D terminal to the Q terminal at a falling edge of clock signal CLK.

Test start pulse STRAT is input to the D terminal of D flip-flop 501 from time t1 to time t3 in FIG. 3. Test start pulse STRAT is input for times including one falling edge of clock signal CLK.

At time t2 when clock signal CLK falls, because the input of the D terminal of D flip-flop 501 is at the high level, D flip-flop 501 is switched to the set state. Thus, an output signal FF1OUT of the Q terminal of D flip-flop 501 is switched to a high level, and an output signal FF1OUTB of the QB terminal of D flip-flop 501 is switched to a low level. The output of the QB terminal is an inverted output of the Q terminal. As a result, the drain of NMOS transistor 401 is electrically connected to power supply node 7 with NMOS transistor 201a in the conducting state interposed therebetween.

At time t4 when clock signal CLK falls next, because the input of the D terminal of D flip-flop 502 is at the high level, the internal state of D flip-flop 502 is switched to the set state. Thus, an output signal FF2OUT of the Q terminal of D flip-flop 502 is switched to the high level, and an output signal FF2OUTB of the QB terminal of D flip-flop 502 is switched to the low level. As a result, the drain of NMOS transistor 402 is electrically connected to power supply node 7 with NMOS transistor 202a in the conducting state interposed therebetween.

On the other hand, at time t4, because the input of the D terminal of D flip-flop 501 already returns to the low level, the internal state of D flip-flop 501 is switched to the reset state. Thus, output signal FF1OUT of the Q terminal of D flip-flop 501 is switched to the low level, and output signal FF1OUTB of the QB terminal of D flip-flop 501 is switched to the high level. As a result, the electrical connection of the drain of NMOS transistor 401 is switched from power supply node 7 to analog circuit block 1.

At time t5 when clock signal CLK falls again, because the input of the D terminal of D flip-flop 503 is at the high level, an internal state of D flip-flop 503 is switched to the set state. Thus, an output signal FF3OUT of the Q terminal of D flip-flop 503 is switched to the high level, and an output signal FF3OUTB of the QB terminal of D flip-flop 503 is switched to the low level. As a result, the drain of NMOS transistor 403 is electrically connected to power supply node 7 with NMOS transistor 203a in the conducting state interposed therebetween.

On the other hand, at time t5, because the input of the D terminal of D flip-flop 502 already returns to the low level, the internal state of D flip-flop 502 is switched to the reset state. Thus, output signal FF2OUT of the Q terminal of D flip-flop 502 is switched to the low level, and output signal FF2OUTB of the QB terminal of D flip-flop 502 is switched to the high level. As a result, the electrical connection of the drain of NMOS transistor 402 is switched from power supply node 7 to analog circuit block 1.

Then, at time t6 when clock signal CLK falls again, because the input of the D terminal of D flip-flop 503 already returns to the low level, the internal state of D flip-flop 503 is switched to the reset state. Thus, output signal FF3OUT of the Q terminal of D flip-flop 503 is switched to the low level, and output signal FF3OUTB of the QB terminal of D flip-flop 503 is switched to the high level. As a result, the electrical connection of the drain of NMOS transistor 403 is switched from power supply node 7 to analog circuit block 1.

In this manner, D flip-flops 501 to 503 are sequentially switched one by one to the high level. Thus, the electrical connections of the drains of current source NMOS transistors 401 to 403 (that is, second ends 40*b* of the plurality of current sources 40) are sequentially switched one by one from analog circuit block 1 to power supply node 7, and then switched again to analog circuit block 1. Thus, the current flowing through each of NMOS transistors 401 to 403 can be sequentially measured one by one from the outside of semiconductor integrated circuit 10 via power supply node 7.

As to the time of the current measurement, for example, it is conceivable to perform the measurement at the time of the rising edge of clock signal CLK in consideration of a stabilization time of the current signal. Furthermore, in order to reduce an error due to noise, an average value of current signals during a period in which clock signal CLK is at the high level may be calculated.

According to the configuration of sequential circuit 5 described above, the magnitude of current generated by individual current sources 40 can be sequentially measured without complicated control. In addition, when the frequency of clock signal CLK is increased, the measurement can be performed at a higher speed. In this case, the frequency of clock signal CLK is required to be determined so as to obtain required measurement accuracy in consideration of the stabilization time and the error due to the noise.

Modification of First Embodiment

In FIGS. 1 and 2, the case where current source 40 functions as current sinking has been described. Similarly, when the current source functions as current sourcing, the output current of each current source 40 can be individually measured from the outside of a semiconductor integrated circuit 10A by switching the electrical connection of the current source from the analog circuit block to the ground node. Hereinafter, a difference from semiconductor integrated circuit 10 in FIGS. 1 and 2 will be mainly described, and the description of portions common to FIGS. 1 and 2 may not be repeated.

Figure 4:
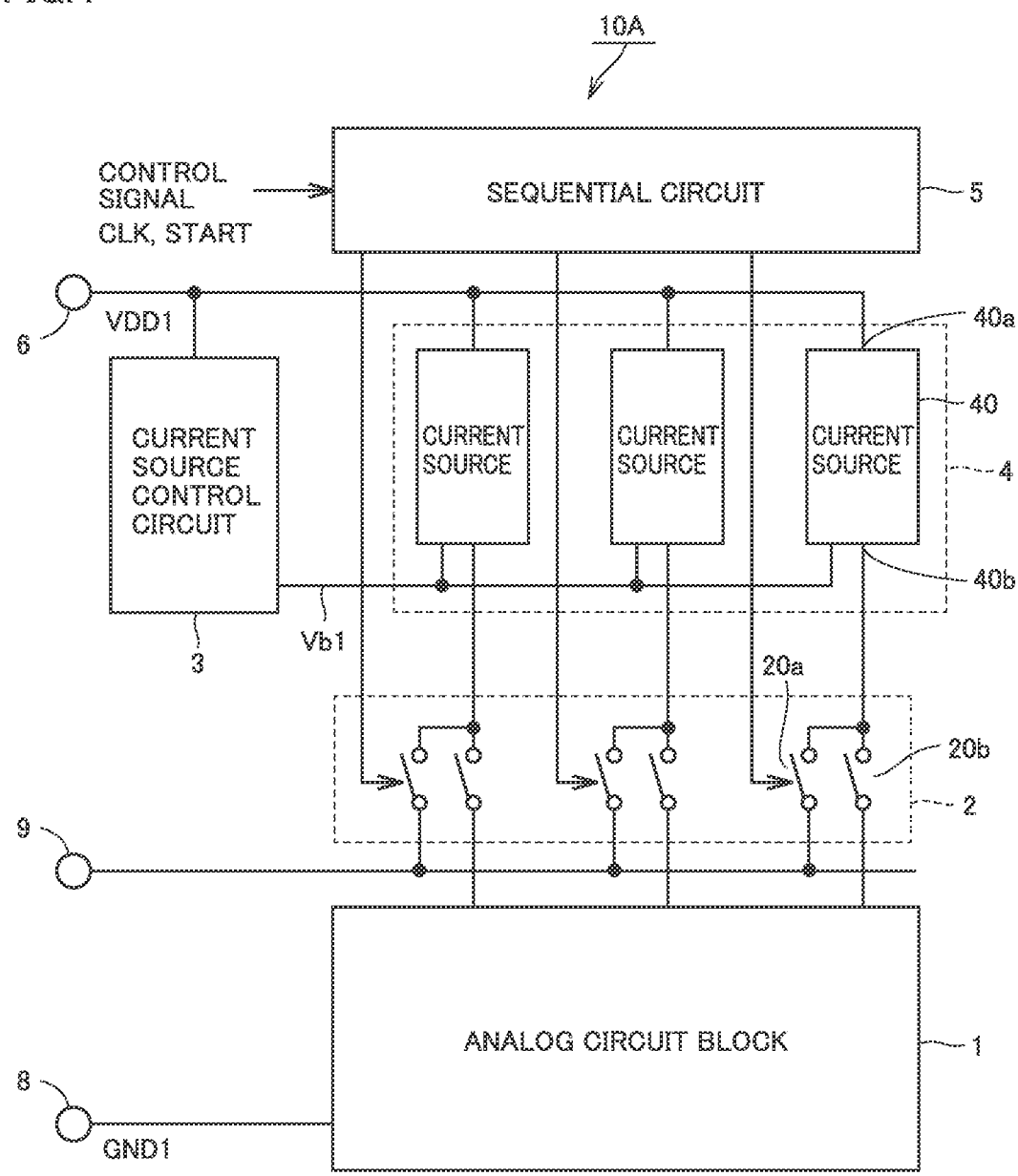
FIG. 4 is a view illustrating a schematic configuration of a modification of the semiconductor integrated circuit in FIG. 1.

FIG. 4 is a view illustrating a schematic configuration of a modification of the semiconductor integrated circuit in FIG. 1. Similarly to semiconductor integrated circuit 10 in FIG. 1, semiconductor integrated circuit 10A in FIG. 4 includes analog circuit block 1, switch group 2, current source control circuit 3, current source group 4, sequential circuit 5, power supply node 6, and ground nodes 8, 9. Analog circuit block 1 is an analog circuit that is operated by power supply voltage VDD1 applied between power supply node 6 and ground node 8.

Current source group 4 includes a plurality of current sources 40. The plurality of current sources 40 are controlled by bias voltage Vb1 supplied from current source control circuit 3. First end 40*a* of each of current sources 40 is connected to power supply node 6, and second end 40*b* of each of current sources 40 is connected to analog circuit block 1 with switch group 2 interposed therebetween. The plurality of current sources 40 function as current sourcing for analog circuit block 1.

Switch group 2 includes a large number of switches. In the normal mode, switch group 2 connects second end 40*b* of each of the plurality of current sources 40 configuring current source group 4 to analog circuit block 1. In the test mode, switch group 2 individually switches the electrical connection of second end 40*b* of each of the plurality of current sources 40 configuring current source group 4 from analog circuit block 1 to ground node 9. Thus, the current flowing from the outside of semiconductor integrated circuit 10A through ground node 9 to each current source 40 configuring current source group 4 can be individually measured.

Sequential circuit 5 controls switch group 2 in response to a control signal. In the case of the modification, sequential circuit 5 is a synchronous sequential circuit that operates in synchronization with clock signal CLK. In response to the control signal (for example, test start pulse START) in the test mode, sequential circuit 5 electrically connects second ends 40*b* of the plurality of current sources 40 configuring current source group 4 to ground node 9 one by one in order. Thus, the currents flowing from the outside of semiconductor integrated circuit 10 to the plurality of current sources 40 configuring current source group 4 can be sequentially measured one by one through ground node 9.

Figure 5:
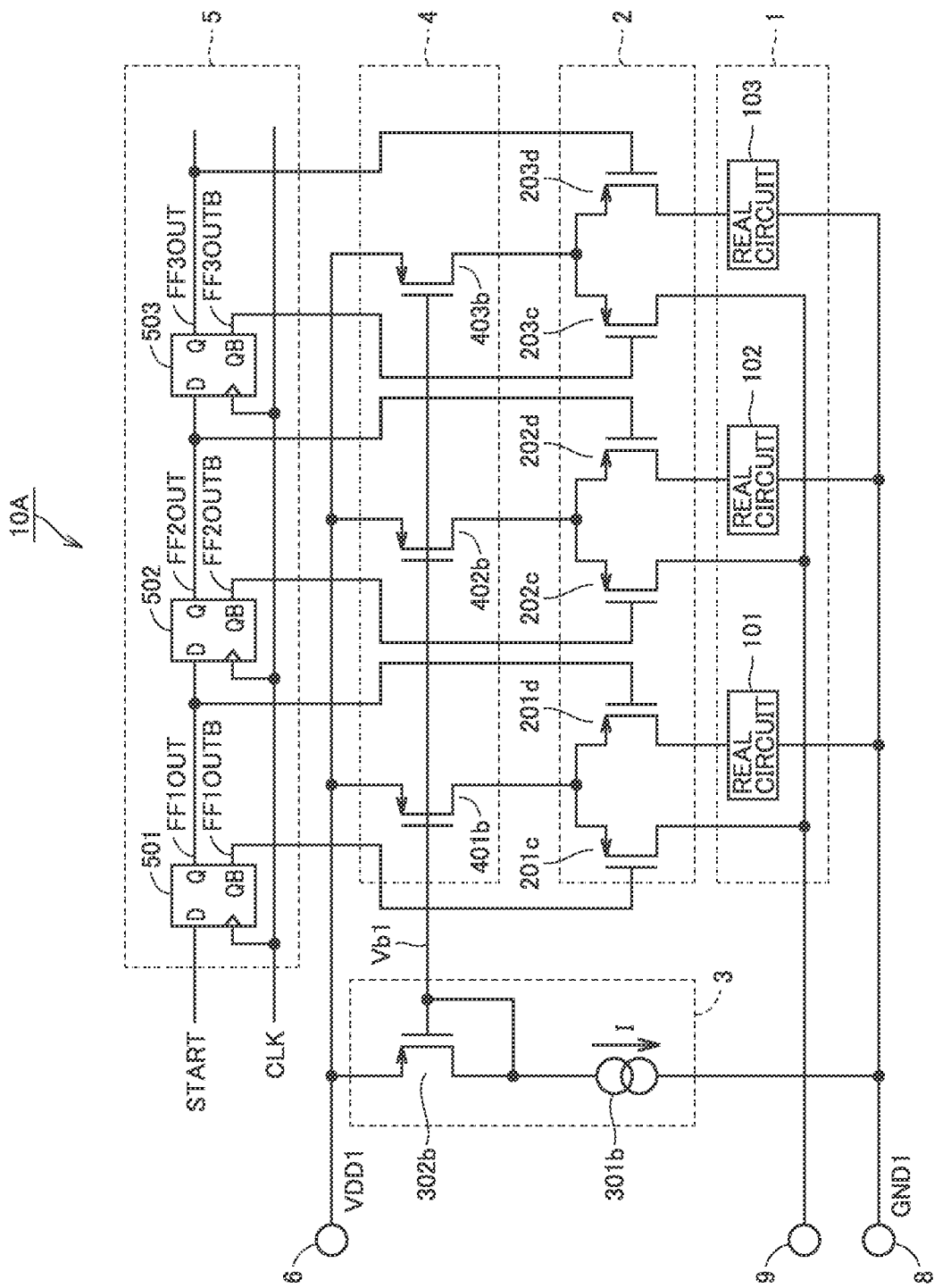
FIG. 5 is a circuit diagram illustrating a specific configuration example of the semiconductor integrated circuit in FIG. 4.

FIG. 5 is a circuit diagram illustrating a specific configuration example of the semiconductor integrated circuit in FIG. 4. The circuit diagram in FIG. 5 corresponds to the circuit diagram in FIG. 2, and the NMOS transistor in FIG. 2 is replaced with a positive-channel metal oxide semiconductor (PMOS) transistor.

As illustrated in FIG. 5, current source group 4 includes a plurality of PMOS transistors 401*b*, 402*b*, 403*b*. The source of each of PMOS transistors 401*b* to 403*b* is connected to power supply node 6. Each of PMOS transistors 401*b* to 403*b* functions as current sourcing that supplies the current from the drain.

Current source control circuit 3 includes a PMOS transistor 302*b* as a reference transistor and a reference current source 301*b* which are connected in series between power supply node 6 and ground node 8. The source of PMOS transistor 302*b* is connected to power supply node 6. Current I flows from the drain of PMOS transistor 302*b* to reference current source 301*b*.

PMOS transistor 302*b* is what is called a diode-connected transistor in which the gate and the drain are connected. When the gate of PMOS transistor 302*b* is connected to the gates of PMOS transistors 401*b* to 403*b* configuring current source group 4, these PMOS transistors configure a current mirror. PMOS transistor 302*b* supplies bias voltage Vb1 to the gates of PMOS transistors 401*b* to 403*b*.

Switch group 2 includes a plurality of sets of switching PMOS transistors (201*c*, 201*d*) to (203*c*, 203*b*), each set being provided for a corresponding one of the plurality of PMOS transistors 401*b* to 403*b* configuring current source group 4.

Each source of PMOS transistors 201*c*, 201*d* is connected to the drain of corresponding PMOS transistor 401*b* (that is, second end 40*b* of corresponding current source 40). The drain of PMOS transistor 201*c* is connected to ground node 9. The drain of PMOS transistor 201*d* is connected to real circuit 101 configuring analog circuit block 1. The gate control signal controlling on and off of PMOS transistors 201*c*, 201*d* is input to the gates of PMOS transistors 201*c*, 201*d* from sequential circuit 5. The same applies to PMOS transistors 202*c*, 202*d* and PMOS transistors 203*c*, 203*d*.

Similarly to the case in FIG. 2, sequential circuit 5 includes D flip-flops 501 to 503 cascade-connected corresponding to PMOS transistors 401*b* to 403*b*. In the case of FIG. 5, the Q terminal of D flip-flop 501 is connected to the gate of PMOS transistor 201*d*, and the QB terminal of D flip-flop 501 is connected to the gate of PMOS transistor 201*c*. The same applies to other D flip-flops 502, 502.

Sequential circuit 5 operates similarly to the case in FIG. 3 based on test start pulse STRAT and clock signal CLK. Thus, the electrical connection of the drains of current source PMOS transistors 401*b* to 403*b* (that is, second ends 40b of the plurality of current sources 40) is sequentially switched one by one from analog circuit block 1 to ground node 9, and then switched again to analog circuit block 1.

Advantageous Effect of First Embodiment

As described above, semiconductor integrated circuit 10 of the first embodiment includes first analog circuit block 1, the plurality of current sources 40 functioning as current sinking for first analog circuit block 1, first switch group 2, the first node (power supply node 6), the second node (power supply node 7), and the third node (ground node 8). First analog circuit block 1 operates by voltage VDD1 applied between the first node (power supply node 6) and the third node (ground node 8). First end 40a of each of the plurality of first current sources 40 is connected to the third node (ground node 8), and second end 40b of each of the plurality of first current sources is connected to first analog circuit block 1 with first switch group 2 interposed therebetween. First switch group 2 is provided between the plurality of first current sources 40 and first analog circuit block 1, and in the test mode, individually switches the electrical connection of second end 40b of each of the plurality of first current sources 40 from first analog circuit block 1 to the second node (power supply node 7). According to the above configuration, the current flowing through each of the plurality of first current sources 40 in the test mode can be individually measured from the outside of semiconductor integrated circuit 10 through the second node (power supply node 7).

Alternatively, semiconductor integrated circuit 10A of the modification of the first embodiment includes first analog circuit block 1, the plurality of current sources 40 functioning as current sourcing for first analog circuit block 1, first switch group 2, the first node (ground node 8), the second node (ground node 9), and the third node (power supply node 6). First analog circuit block 1 operates by voltage VDD1 applied between the first node (ground node 8) and the third node (power supply node 6). First end 40a of each of the plurality of first current sources 40 is connected to the third node (power supply node 6), and second end 40b of each of the plurality of first current sources is connected to first analog circuit block 1 with first switch group 2 interposed therebetween. First switch group 2 is provided between the plurality of first current sources 40 and first analog circuit block 1, and in the test mode, individually switches the electrical connection of second end 40b of each of the plurality of first current sources 40 from first analog circuit block 1 to the second node (ground node 9). According to the above configuration, the current flowing through each of the plurality of first current sources 40 in the test mode can be individually measured from the outside of semiconductor integrated circuit 10 through the second node (ground node 9).

Alternatively, the configuration of semiconductor integrated circuit 10 and modified semiconductor integrated circuit 10A may be combined. In the test mode, the current of each current source 40 functioning as current sinking can be measured from the outside of the semiconductor integrated circuit (10, 10 A) through power supply node 7 different from power supply node 6 for analog circuit block 1. In addition, the current of each current source 40 functioning as current sourcing can be individually measured from the outside of semiconductor integrated circuit 10 through ground node 9 different from ground node 8 for analog circuit block 1.

Semiconductor integrated circuits 10, 10A of the first embodiment further include sequential circuit 5 that controls first switch group 2. Sequential circuit 5 includes the plurality of D flip-flops 501 to 503 cascade-connected, each set being provided for a corresponding one of the plurality of current sources 40 configuring current source group 4. Each D flip-flop controls switch group 2 so as to electrically connect corresponding current source 40 to the second node (power supply node 7 and ground node 9) in the set state. According to sequential circuit 5 having the above configuration, the value of current generated by each current source 40 can be measured at high speed with simple control.

Second Embodiment

In a second embodiment, a case where a semiconductor integrated circuit 10B includes two analog circuit blocks 110, 120 and power supply voltages of these analog circuit blocks 110, 120 are different will be described. In this case, power supply node 6 for one analog circuit block 110 is different from power supply node 7 for the other analog circuit block 120, and therefore power supply node 7 for the other analog circuit block 120 can be used when current source 40 for one analog circuit block 110 is measured.

Specifically, first end 40a of current source 40 functioning as current sinking is connected to ground node 8, and second end 40b thereof is connected to analog circuit block 110. Accordingly, the current flowing through each current source 40 can be individually measured by switching the electrical connection of second end 40b of current source 40 from analog circuit block 110 to power supply node 7 for the other analog circuit block 120.

In the case where ground node 8 for one analog circuit block 110 is different from ground node 9 for the other analog circuit block 120, the current flowing through current source 40 functioning as current sourcing can be individually measured. Specifically, first end 40a of current source 40 functioning as current sourcing is connected to power supply node 6, and second end 40b thereof is connected to analog circuit block 110. Accordingly, the current flowing through each current source 40 can be individually measured by switching the electrical connection of second end 40b of current source 40 from analog circuit block 110 to ground node 9 for the other analog circuit block 120.

The case where each current source 40 functions as current sinking as previously described with reference to FIGS. 1 and 2 will be described below. Even in the case where each of current sources 40 functions as current sourcing as previously described with reference to FIGS. 4 and 5, the current flowing through each of current sources 40 can be measured by a similar method. In the following description, portions corresponding to FIGS. 1 and 2 of the first embodiment will not be described repeatedly.

[Schematic Configuration of Semiconductor Integrated Circuit]

Figure 6:
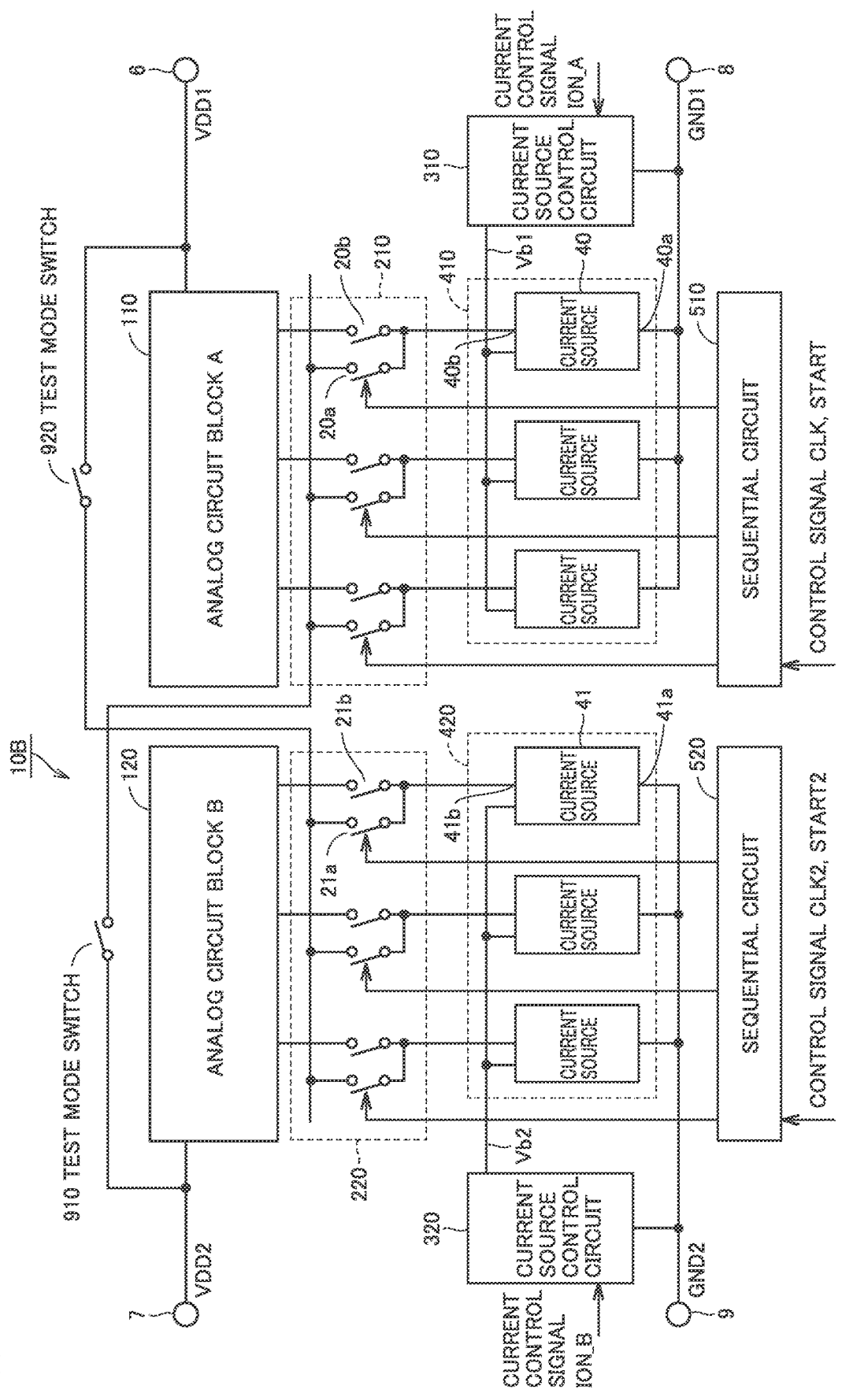
FIG. 6 is a block diagram illustrating a schematic configuration of a semiconductor integrated circuit according to a second embodiment.

FIG. 6 is a block diagram illustrating a schematic configuration of the semiconductor integrated circuit of the second embodiment. With reference to FIG. 6, semiconductor integrated circuit 10B includes analog circuit blocks (A, B) 110, 120, switch groups 210, 220, current source control circuits 310, 320, current source groups 410, 420, sequential circuits 510, 520, power supply nodes 6, 7, ground nodes 8, 9, and test mode switches 910, 920.

Power supply voltage VDD1 is supplied to power supply node 6, and power supply voltage VDD2 is supplied to power supply node 7. Reference potential GND1 is applied to ground node 8, and a reference potential GND2 is applied to ground node 9. Analog circuit block 110 is operated by power supply voltage VDD1 applied between power supply node 6 and ground node 8. Analog circuit block 120 is operated by power supply voltage VDD2 applied between power supply node 7 and ground node 9. Ground node 8 and ground node 9 may be common.

Analog circuit block 110, switch group 210, current source control circuit 310, current source group 410, and sequential circuit 510 correspond to analog circuit block 1, switch group 2, current source control circuit 3, current source group 4, and sequential circuit 5 in FIG. 1, respectively.

In the case of these circuits, test mode switch 910 is provided between switch group 210 and power supply node 7. In the case of the normal mode, second end 40b of each current source 40 configuring current source group 410 is electrically connected to analog circuit block 110 with switch group 210 interposed therebetween. In the case of the test mode in which the current of each current source 40 of current source group 410 is measured, second end 40b of each current source 40 configuring current source group 410 is individually electrically connected to power supply node 7 with switch group 210 and test mode switch 910 interposed therebetween.

Test mode switch 910 is controlled to the conduction state (on state) in the test mode of current source group 410, and controlled to the non-conduction state (off state) in the normal mode. In this manner, by providing test mode switch 910 closer to power supply node 7 than switch group 210, unnecessary noise can be prevented from reaching analog circuit block 120 in the normal mode.

In the test mode of current source group 410, sequential circuit 510 electrically connects second ends 40b of the plurality of current sources 40 configuring current source group 410 to power supply node 7 one by one in order based on the control signal (clock signal CLK, test start pulse STRAT). Thus, in the test mode of current source group 410, the current flowing through each current source 40 configuring current source group 410 can be individually measured.

Analog circuit block 120, switch group 220, current source control circuit 320, current source group 420, and sequential circuit 520 also correspond to analog circuit block 1, switch group 2, current source control circuit 3, current source group 4, and sequential circuit 5 in FIG. 1, respectively. These circuits in FIG. 6 are connected to power supply node 7 and ground node 9 instead of power supply node 6 and ground node 8 described above. Switch group 220 includes two switches 21a, 21b corresponding to each of current sources 41. Second end 41b of each current source 41 is connected to power supply node 7 with corresponding switch 21a interposed therebetween, and connected to analog circuit block 1 with corresponding switch 21b interposed therebetween.

Test mode switch 920 is provided between switch group 220 and power supply node 6. Similarly to the case of test mode switch 910, test mode switch 920 is controlled to the conduction state (on state) in the test mode in which the current of each current source 41 of current source group 420 is measured, and controlled to the non-conduction state (off state) in the normal mode. In the case of the normal mode, second end 41b of each current source 41 configuring current source group 420 is electrically connected to analog circuit block 120 with switch group 220 interposed therebetween. In the case of the test mode in which the current of each current source 41 of current source group 420 is measured, second end 41b of each current source 41 configuring current source group 420 is individually electrically connected to power supply node 6 with switch group 220 and test mode switch 920 interposed therebetween.

In the test mode of current source group 420, sequential circuit 520 sequentially connects second ends 41b of the plurality of current sources 41 configuring current source group 420 to power supply node 7 one by one based on the control signal (clock signal CLK2, test start pulse STRAT2). Thus, in the test mode, the current flowing through each current source 41 configuring current source group 420 can be individually measured.

Semiconductor integrated circuit 10B in FIG. 6 is further different from semiconductor integrated circuit 10 in FIG. 1 in that current control signals ION_A, ION_B are input to current source control circuits 310, 320. In the test mode in which the current measurement of each current source 41 of current source group 420 is performed, current source control circuit 310 sets to zero or decreases the current flowing through each current source 40 configuring current source group 410 in response to current control signal ION_A. Thus, the influence of current source group 410 on the current measurement of each current source 41 can be suppressed. Similarly, in the test mode in which the current measurement of each current source 40 of current source group 410 is performed, current source control circuit 320 sets to zero or decreases the current flowing through each current source 41 configuring current source group 420 in response to current control signal ION_B. Thus, the influence of current source group 420 on the current measurement of each current source 40 can be suppressed.

[Specific Configuration Example of Semiconductor Integrated Circuit]

Figure 7:
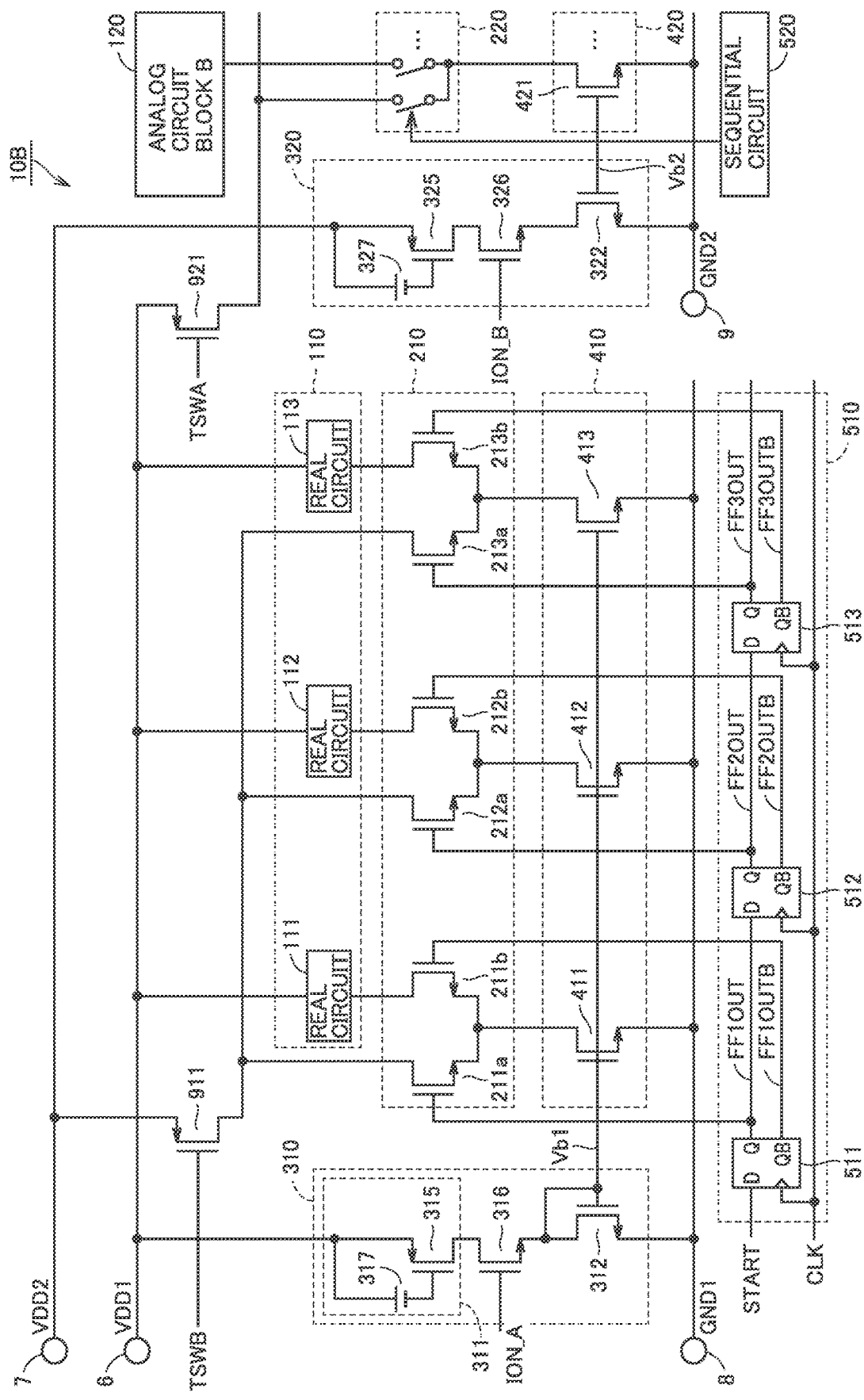
FIG. 7 is a circuit diagram illustrating a specific configuration example of the semiconductor integrated circuit in FIG. 6.

FIG. 7 is a circuit diagram illustrating a specific configuration example of the semiconductor integrated circuit in FIG. 6. FIG. 7 illustrates specific configuration examples of current source group 410, current source control circuit 310, switch group 210, analog circuit block 110, sequential circuit 510, and test mode switch 910 in FIG. 6. In addition, specific configuration examples of current source group 420, current source control circuit 320, and test mode switch 920 in FIG. 6 are briefly illustrated.

In the circuit diagram of FIG. 7, the configurations of analog circuit block 110, current source group 410, switch group 210, and sequential circuit 510 are the same as the configurations of analog circuit block 1, current source group 4, switch group 2, and sequential circuit 5 in FIG. 2. Specifically, real circuits 111 to 113 configuring analog circuit block 110 correspond to real circuits 101 to 103 in FIG. 2, respectively. NMOS transistor 411 to 413 configuring current source group 410 corresponds to NMOS transistor 401 to 403 in FIG. 2. NMOS transistors (211a, 211b) to (213a, 213b) configuring switch group 210 correspond to NMOS transistors (201a, 201b) to (203a, 203b) in FIG. 2. D flip-flops 511 to 513 configuring sequential circuit 510 correspond to D flip-flops 501 to 503 in FIG. 2. Accordingly, the connection of these elements will not be described again.

Current source control circuit 310 includes NMOS transistors 312, 316, a PMOS transistor 315, and a constant voltage source 317. PMOS transistor 315, NMOS transistor 316, and NMOS transistor 312 are connected in series between power supply node 6 and ground node 8 in this order.

Constant voltage source 317 is, for example, a band gap reference voltage generation circuit, and is adjusted so as to have small temperature dependency. Constant voltage source 317 is connected between the source and the gate of PMOS transistor 315. Constant voltage source 317 and PMOS transistor 315 configure a reference current source 311.

NMOS transistor 312 is what is called a diode-connected transistor in which the gate and the drain are connected. The gate of NMOS transistor 312 is connected to each gate of NMOS transistors 411 to 413 configuring current source group 410. Thus, NMOS transistors 312, 411 to 413 configure a current mirror.

Current control signal ION_A is input to the gate of NMOS transistor 316. In the normal mode, current control signal ION_A is controlled to the high level, so that NMOS transistor 316 is brought into the conductive state. In the test mode of current source group 420, current control signal ION_A is controlled to the low level, so that NMOS transistor 316 is brought into the non-conductive state. Thus, the influence on the current measurement of each current source 41 of current source group 420 is suppressed.

PMOS transistor 911 is provided as test mode switch 910 in FIG. 6. The source of PMOS transistor 911 is connected to power supply node 7. The drain of PMOS transistor 911 is connected to the drains of NMOS transistors 211a, 212a, 213a configuring switch group 210. A control signal TSWB supplied to the gate of PMOS transistor 911 is controlled to the high level in the normal mode, and controlled to the low level in the test mode of current source group 410. Thus, PMOS transistor 911 becomes the non-conductive state in the normal mode, and becomes the conductive state in the test mode of current source group 410.

Specific configurations of current source group 420, current source control circuit 320, and test mode switch 920 in FIG. 6 are similar to specific configurations of current source group 410, current source control circuit 320, and test mode switch 910. In FIG. 7, an NMOS transistor 421 configuring current source group 420 corresponds to NMOS transistor 411. NMOS transistors 322, 326, a PMOS transistor 325, and a constant voltage source 327 configuring current source control circuit 320 correspond to NMOS transistor 312, 316, PMOS transistor 315, and constant voltage source 317. Accordingly, these elements will not be explained again.

PMOS transistor 921 is provided as test mode switch 920 in FIG. 6. The source of PMOS transistor 921 is connected to power supply node 6. The drain of PMOS transistor 921 is connected to switch group 220. A control signal TSWA supplied to the gate of PMOS transistor 921 is controlled to the high level in the normal mode, and controlled to the low level in the test mode of current source group 420. Thus, PMOS transistor 921 becomes the non-conductive state in the normal mode, and becomes the conductive state in the test mode of current source group 420.

[Operation of Sequential Circuit]

Figure 8:
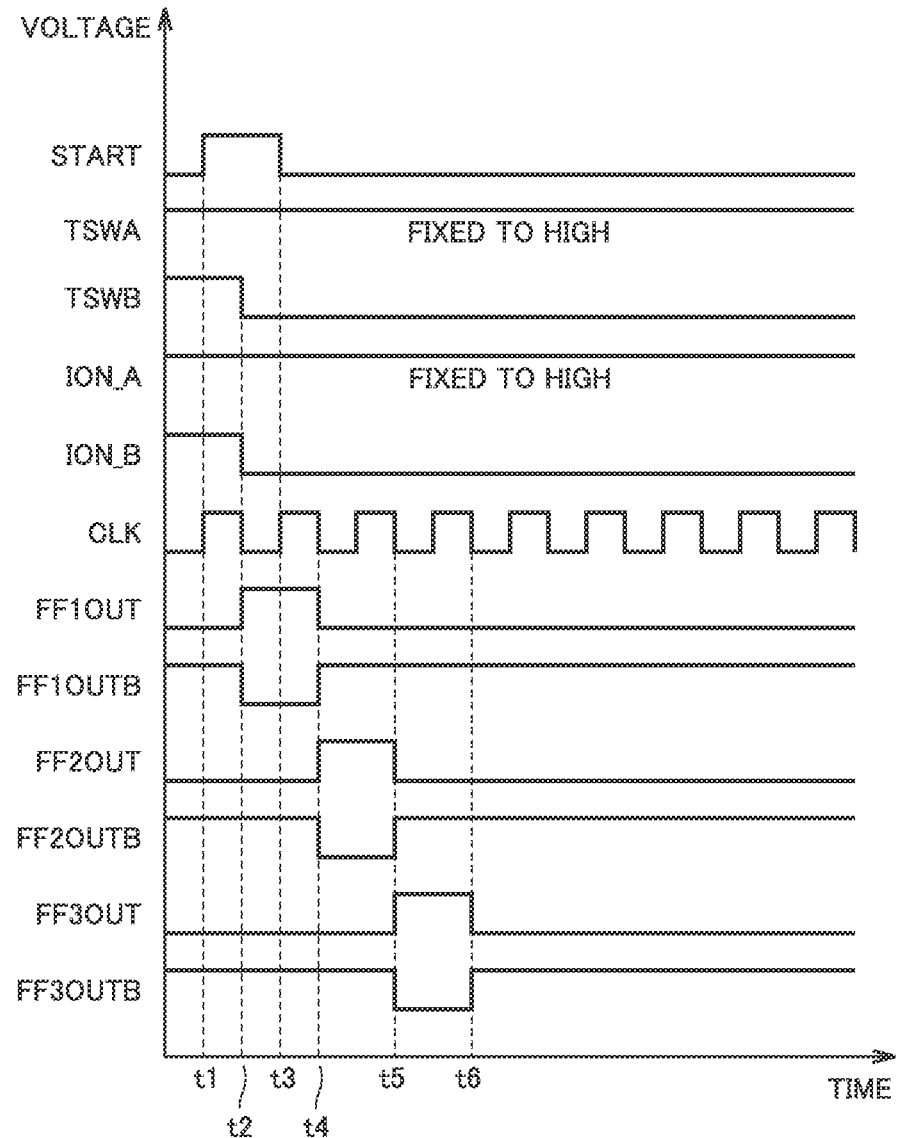
FIG. 8 is a timing chart illustrating operation of a sequential circuit in FIG. 7.

FIG. 8 is a timing chart illustrating the operation of the sequential circuit in FIG. 7. FIG. 8 illustrates the operation of sequential circuit 510 in the case of measuring the current flowing through current source NMOS transistors 411 to 413 configuring current source group 410 in FIG. 7. In the following description, each of D flip-flops 511 to 513 changes the internal state of each of D flip-flops 511 to 513 at the falling edge of clock signal CLK.

With reference to FIG. 8, at the time of current measurement of current source group 410, control signal TSWA and current control signal ION_A are fixed to the high level. Accordingly, PMOS transistor 921 is controlled to the non-conductive state, and NMOS transistor 316 is controlled to the conductive state.

Between time t1 and time t3, test start pulse STRAT is input to the D terminal of D flip-flop 511.

At time t2 between time t1 and time t3, control signal TSWB and current control signal ION_B are switched to the low level. Thus, PMOS transistor 911 between switch group 210 and power supply node 7 is controlled to be in the conductive state. Furthermore, the current flowing through the NMOS transistor (421 or the like) used as each current source configuring current source group 420 becomes zero by controlling NMOS transistor 326 to be in the non-conductive state.

At time t2, clock signal CLK further falls. At this time, because the input of the D terminal of D flip-flop 511 is at the high level, D flip-flop 511 is switched to the set state. Thus, output signal FF1OUT of the Q terminal of D flip-flop 511 is switched to the high level, and output signal FF of the QB terminal of D flip-flop 511 is switched to the low level. As a result, the drain of NMOS transistor 411 is electrically connected to power supply node 7.

At time t4 when clock signal CLK falls next, because the input of the D terminal of D flip-flop 512 is at the high level, the internal state of D flip-flop 512 is switched to the set state. Thus, output signal FF2OUT of the Q terminal of D flip-flop 512 is switched to the high level, and output signal FF2OUTB of the QB terminal of D flip-flop 512 is switched to the low level. As a result, the drain of NMOS transistor 412 is electrically connected to power supply node 7.

On the other hand, at time t4, because the input of the D terminal of D flip-flop 511 already returns to the low level, the internal state of D flip-flop 511 is switched to the reset state. Thus, output signal FF of the Q terminal of D flip-flop 511 is switched to the low level, and output signal FF1OUTB of the QB terminal of D flip-flop 511 is switched to the high level. As a result, the electrical connection of the drain of NMOS transistor 411 is switched from power supply node 7 to analog circuit block 110.

At time t5 when clock signal CLK falls next, because the input of the D terminal of D flip-flop 513 is at the high level, the internal state of D flip-flop 513 is switched to the set state. Thus, output signal FF3OUT of the Q terminal of D flip-flop 513 is switched to the high level, and output signal FF3OUTB of the QB terminal of D flip-flop 513 is switched to the low level. As a result, the drain of NMOS transistor 413 is electrically connected to power supply node 7.

On the other hand, at time t5, because the input of the D terminal of D flip-flop 512 already returns to the low level, the internal state of D flip-flop 512 is switched to the reset state. Thus, output signal FF2OUT of the Q terminal of D flip-flop 512 is switched to the low level, and output signal FF2OUTB of the QB terminal of D flip-flop 512 is switched to the high level. As a result, the electrical connection of the drain of NMOS transistor 412 is switched from power supply node 7 to analog circuit block 110.

At time t6 when clock signal CLK falls next, because the input of the D terminal of D flip-flop 513 already returns to the low level, the internal state of D flip-flop 513 is switched to the reset state. Thus, output signal FF3OUT of the Q terminal of D flip-flop 513 is switched to the low level, and output signal FF3OUTB of the QB terminal of D flip-flop 513 is switched to the high level. As a result, the electrical connection of the drain of NMOS transistor 413 is switched from power supply node 7 to analog circuit block 110.

In this manner, D flip-flops 511 to 513 are sequentially switched one by one to the high level. Thus, the connection of the drains of current source NMOS transistors 411 to 413 (that is, second ends 40b of the plurality of current sources 40) is sequentially switched one by one from analog circuit block 110 to power supply node 7, and then switched again to analog circuit block 110. Thus, the currents flowing through NMOS transistors 411 to 413 can be sequentially measured one by one.

Advantageous Effect of Second Embodiment

As described above, in semiconductor integrated circuit 10B having the plurality of power supply nodes 6, 7 for the plurality of analog circuit blocks 110, 120, when the currents of current sources 40 for certain analog circuit block 110 are measured, current sources 41 for another analog circuit block 120 are set to zero. Thus, power supply node 7 for another analog circuit block 120 can be used as a current measurement terminal for current sources 40, and therefore there is an advantage that the external connection terminal for current measurement is not required to be newly provided.

Not current source 41 for the other analog circuit block 120 may be set to zero, but may be set to the current smaller than the current of current source 40 to be measured. In this case, considering an offset by current source 41, the decrease in current measurement accuracy can be prevented.

Third Embodiment

In a third embodiment, the case where a semiconductor integrated circuit 10C includes analog circuit block 110 and a digital circuit block 130, namely, the case of a mixed signal circuit in which a digital circuit and an analog circuit are mixedly mounted will be described. In this case, power supply node 6 for analog circuit block 110 and power supply node 7 for digital circuit block 130 are separated due to avoidance of digital noise and a difference in operating power supply voltage. In this case, when the current of current source 40 for analog circuit block 110 is measured, power supply node 7 for digital circuit block 130 can be used as the current measurement terminal.

Specifically, first end 40a of current source 40 functioning as current sinking is connected to ground node 8, and second end 40b is connected to analog circuit block 110. Accordingly, the current flowing through each current source 40 can be individually measured by switching the electrical connection of second end 40b of current source 40 from analog circuit block 110 to power supply node 7 for digital circuit block 130.

On the other hand, in the case where ground node 8 for analog circuit block 110 and ground node 9 for digital circuit block 130 are separated, current generated by current source 40 functioning as current sourcing can be measured. Specifically, first end 40a of current source 40 functioning as current sourcing is connected to power supply node 6, and second end 40b is connected to analog circuit block 110. Accordingly, the current flowing through each current source 40 can be individually measured by switching the electrical connection of second end 40b of current source 40 from analog circuit block 110 to ground node 9 for digital circuit block 130.

The case where each current source 40 functions as current sinking as previously described with reference to FIGS. 1 and 2 will be described below. Even in the case where each of current sources 40 functions as current sourcing as previously described with reference to FIGS. 4 and 5, the current flowing through each of current sources 40 can be measured by a similar method. In the following description, portions corresponding to FIGS. 1 and 2 of the first embodiment and FIGS. 6 and 7 of the second embodiment may not be described repeatedly.

[Schematic Configuration of Semiconductor Integrated Circuit]

Figure 9:
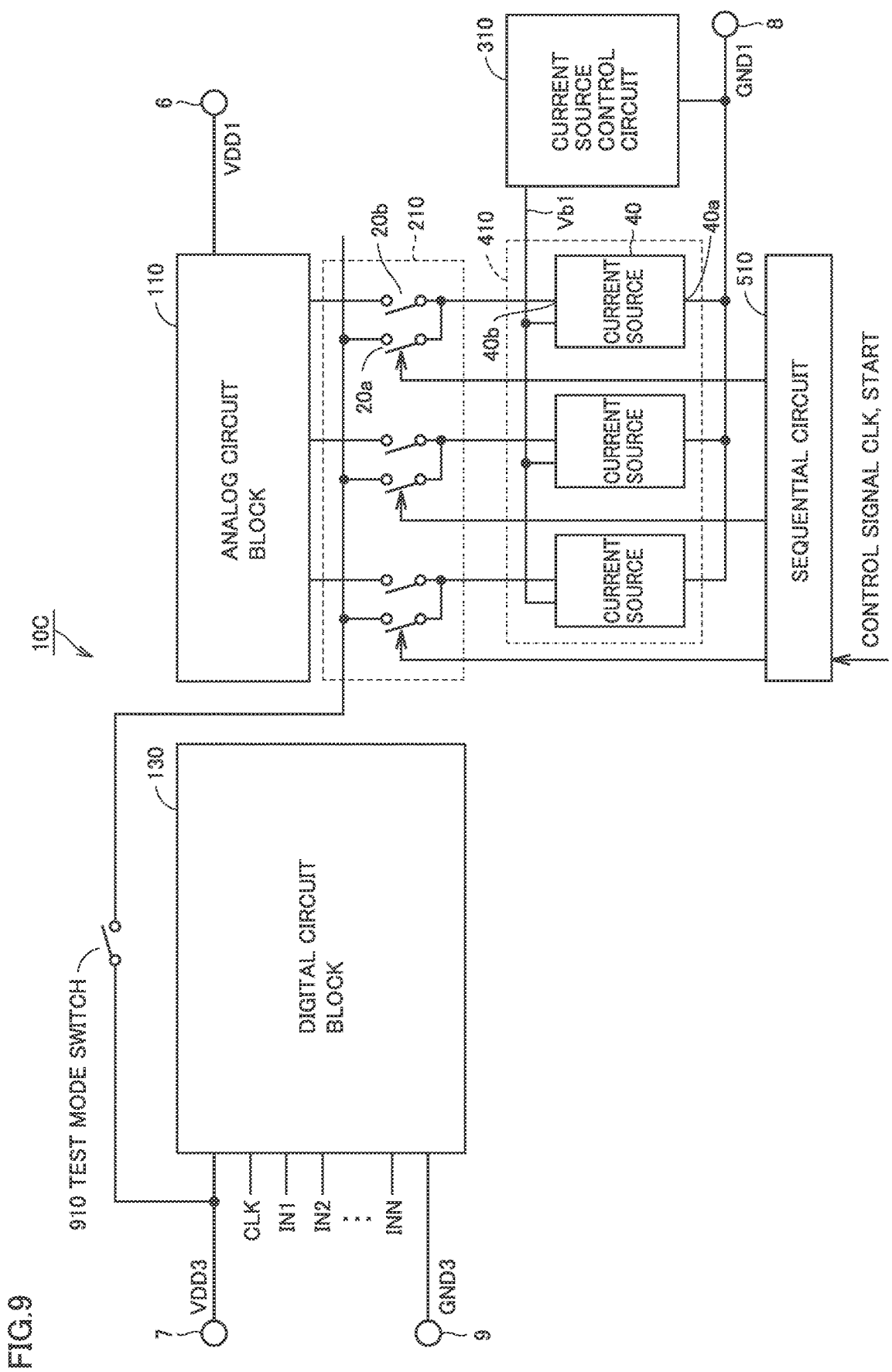
FIG. 9 is a block diagram illustrating a schematic configuration of a semiconductor integrated circuit according to a third embodiment.

FIG. 9 is a block diagram illustrating a schematic configuration of the semiconductor integrated circuit of the third embodiment. With reference to FIG. 9, semiconductor integrated circuit 10C includes analog circuit block 110, digital circuit block 130, switch group 210, current source control circuit 310, current source group 410, sequential circuit 510, power supply nodes 6, 7, ground nodes 8, 9, and test mode switch 910.

Similarly to the case in FIG. 6, power supply voltage VDD1 is supplied to power supply node 6, and power supply voltage VDD2 is supplied to power supply node 7. Reference potential GND1 is applied to ground node 8, and a reference potential GND2 is applied to ground node 9. Analog circuit block 110 is operated by power supply voltage VDD1 applied between power supply node 6 and ground node 8.

Because analog circuit block 110, switch group 210, current source group 410, sequential circuit 510, and test mode switch 910 in FIG. 9 are similar to those in FIG. 6, the explanation thereof will not be repeated. Current source control circuit 310 in FIG. 9 is different from the case in FIG. 6 in that current source control circuit 310 in FIG. 9 does not have the current control function by current control signal ION_A. This is because the current flowing through the current source provided in digital circuit block 130 is not required to be measured.

Digital circuit block 130 is operated by power supply voltage VDD2 applied between power supply node 7 and ground node 9. As an example, clock signal CLK and digital input signals IN1, IN2, ..., INN are input to digital circuit block 130.

[Specific Configuration Example of Semiconductor Integrated Circuit]

Figure 10:
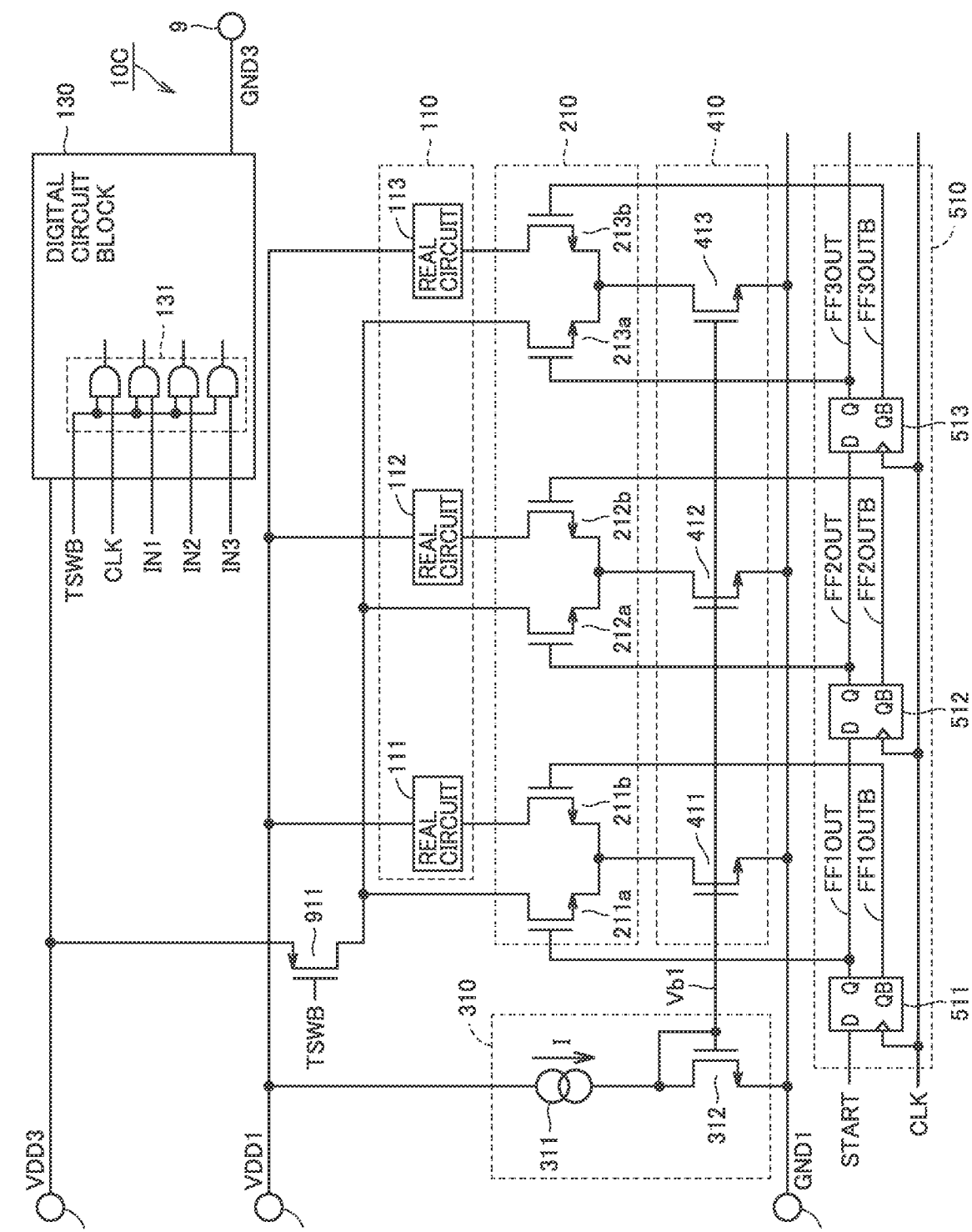
FIG. 10 is a circuit diagram illustrating a specific configuration example of the semiconductor integrated circuit in FIG. 9.

FIG. 10 is a circuit diagram illustrating a specific configuration example of the semiconductor integrated circuit in FIG. 9. FIG. 10 illustrates specific configuration examples of current source group 410, current source control circuit 310, switch group 210, analog circuit block 110, sequential circuit 510, and test mode switch 910 in FIG. 9. In addition, a configuration example of input interface 131 of digital circuit block 130 is illustrated.

In the circuit diagram of FIG. 10, the configuration and connection of analog circuit block 110, switch group 210, current source group 410, sequential circuit 510, and PMOS transistor 911 as test mode switch 910 are similar to those in the case of FIG. 7. Accordingly, the same or corresponding component is denoted by the same reference numeral, and the explanation thereof will not be repeated.

Current source control circuit 310 in FIG. 10 is different from current source control circuit 310 in FIG. 7 in that NMOS transistor 316 is not provided. This is because the current flowing through the current source provided in digital circuit block 130 is not required to be measured, and thus, the current flowing through current source group 410 is not required to be set to zero.

Input interface 131 of digital circuit block 130 includes a plurality of AND gates that perform an arithmetic operation of a logical product of the input signal (for example, clock signal CLK and digital input signals IN1, IN2, ...) of digital circuit block 130 and control signal TSWB.

In the normal mode, control signal TSWB is controlled to the high level. Thus, each input signal of digital circuit block 130 is directly input to the internal circuit of digital circuit block 130. Furthermore, PMOS transistor 911 configuring test mode switch 910 is controlled to be in the non-conductive state.

On the other hand, in the test mode in which the current value of each of current source NMOS transistors 411 to 413 configuring current source group 410 is measured, control signal TSWB is controlled to the low level. Thus, each input signal of digital circuit block 130 is fixed to the low level by an AND operation with control signal TSWB. As a result, because the power consumption in digital circuit block 130 becomes zero, the current measurement of NMOS transistor 411 to 413 for each current source can be prevented from being affected. The method for fixing the logic level of each input signal of digital circuit block 130 is not limited to this method.

Furthermore, when measuring the current of each of current source NMOS transistors 411 to 413, PMOS transistor 911 configuring test mode switch 910 is controlled to be in the conductive state. Thus, the current flowing through NMOS transistor 411 to 413 for each current source can be measured through power supply node 7.

[Operation of Sequential Circuit]

Figure 11:
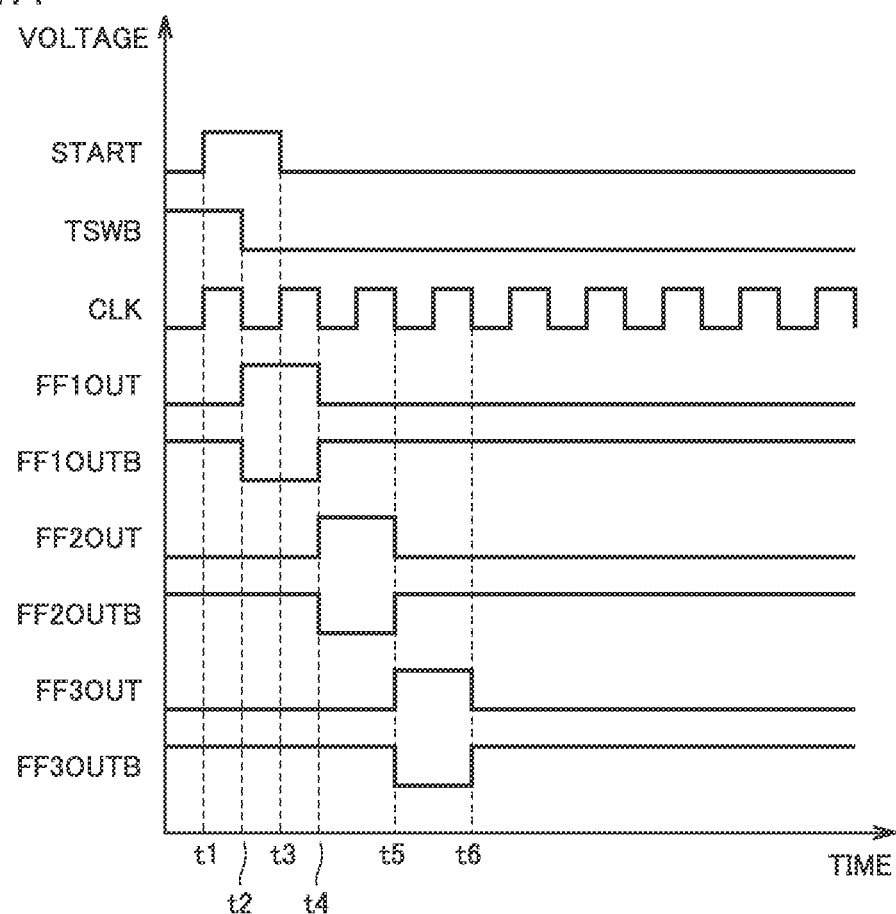
FIG. 11 is a timing chart illustrating operation of a logic circuit in FIG. 10.

FIG. 11 is a timing chart illustrating operation of a logic circuit in FIG. 10. FIG. 11 illustrates the operation of sequential circuit 510 in the case of measuring the current flowing through current source NMOS transistors 411 to 413 configuring current source group 410 in FIG. 10. In the following description, each of D flip-flops 511 to 513 changes the internal state thereof at the falling edge of clock signal CLK.

Between time t1 and time t3, test start pulse STRAT is input to the D terminal of D flip-flop 511.

At time t2 between time t1 and time t3, control signal TSWB is switched to the low level. Thus, PMOS transistor 911 between switch group 210 and power supply node 7 is controlled to be in the conductive state. Furthermore, in input interface 131 of digital circuit block 130, each input signal of digital circuit block 130 is fixed to the low level. As a result, the power consumption of digital circuit block 130 becomes zero.

Because the operations of D flip-flop 511 to 513 after time t2 are similar to those in the case of FIG. 8, the description thereof will not be repeated.

Advantageous Effect of Third Embodiment

As described above, in the case of semiconductor integrated circuit 10C including analog circuit block 110 and digital circuit block 130, when the current of each current source 40 of analog circuit block 110 is measured, the logic levels of signals input to digital circuit block 130 are fixed, and the current consumption of digital circuit block 130 is set to zero. Thus, power supply node 7 for digital circuit block 130 can be used as the current measurement terminal for current sources 40, and therefore there is an advantage that the external connection terminal for current measurement is not required to be newly provided.

Fourth Embodiment

In a fourth embodiment, a specific example of current measurement circuit 16 connected to power supply node 7 of semiconductor integrated circuit 10D will be described. Furthermore, the case where a plurality of spare current sources are provided in current source group 410, and the entire plurality of current sources are switched to the plurality of spare current sources based on the measurement result of current measurement circuit 16 will be described. Although the case where analog circuit block 110 and digital circuit block 130 are provided in semiconductor integrated circuit 10D will be described below, the technique of the fourth embodiment can be similarly applied to the case where a plurality of analog circuit blocks are provided in the semiconductor integrated circuit.

[Current Measurement Circuit]

Figure 12:
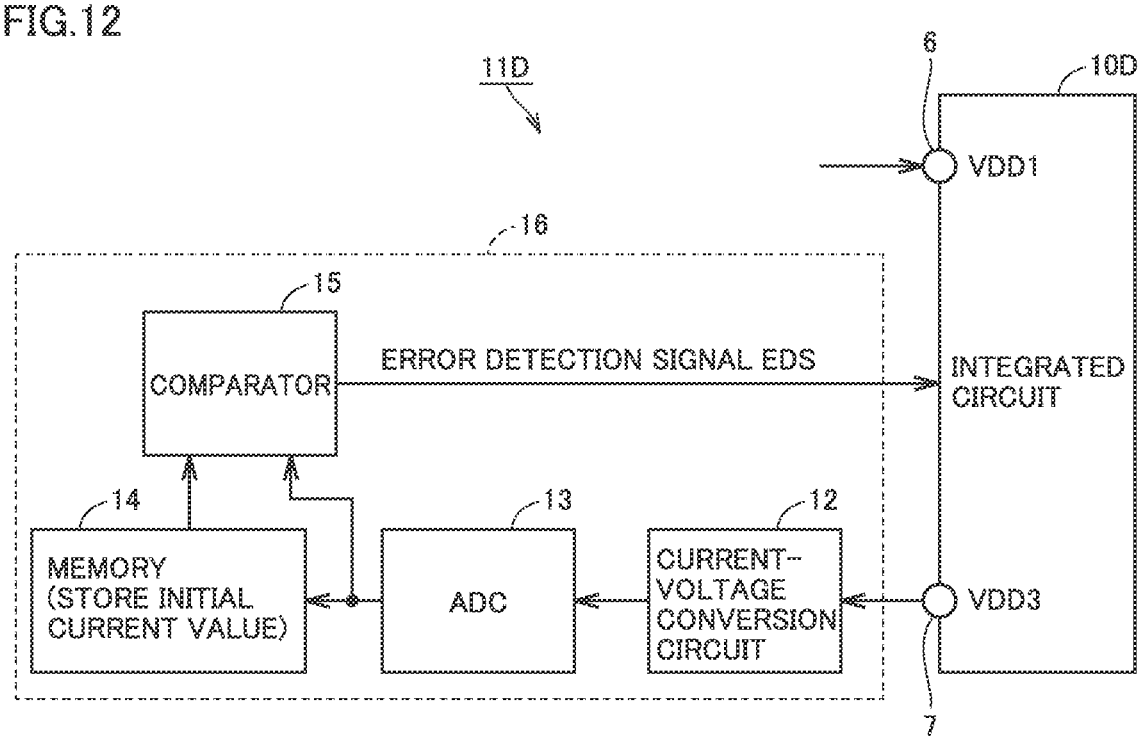
FIG. 12 is a circuit diagram illustrating a configuration example of a current measurement circuit connected to a power supply node of the semiconductor integrated circuit.

FIG. 12 is a circuit diagram illustrating a configuration example of the current measurement circuit connected to the power supply node of the semiconductor integrated circuit. Although FIG. 12 illustrates an example in which a semiconductor device 11E includes semiconductor integrated circuit 10D and separate current measurement circuit 16, current measurement circuit 16 may be included in semiconductor integrated circuit 10D.

With reference to FIG. 12, current measurement circuit 16 includes a current-voltage conversion circuit 12, an analog-to-digital converter (ADC) 13, a memory 14, and a comparator 15.

Current-voltage conversion circuit 12 takes in the current flowing through the current source connected to power supply node 7 in the test mode, and converts the taken current into the voltage. Analog-to-digital converter 13 converts a voltage value into a digital value, the voltage value being obtained by the current-voltage conversion performed by current-voltage conversion circuit 12. As a result, the value of the current flowing through the current source is digitally converted. Memory 14 stores the digitally converted current value. Comparator 15 compares the digitally converted current value at the present time with the initial current value stored in memory 14. Comparator 15 activates an error detection signal EDS (for example, changes it to the high level) when the absolute value of the difference between the current value at the present time and the initial current value exceeds the threshold. Error detection signal EDS is input to semiconductor integrated circuit 10D. Once error detection signal EDS is activated, the active state is maintained.

[Configuration of Semiconductor Integrated Circuit]

Figure 13:
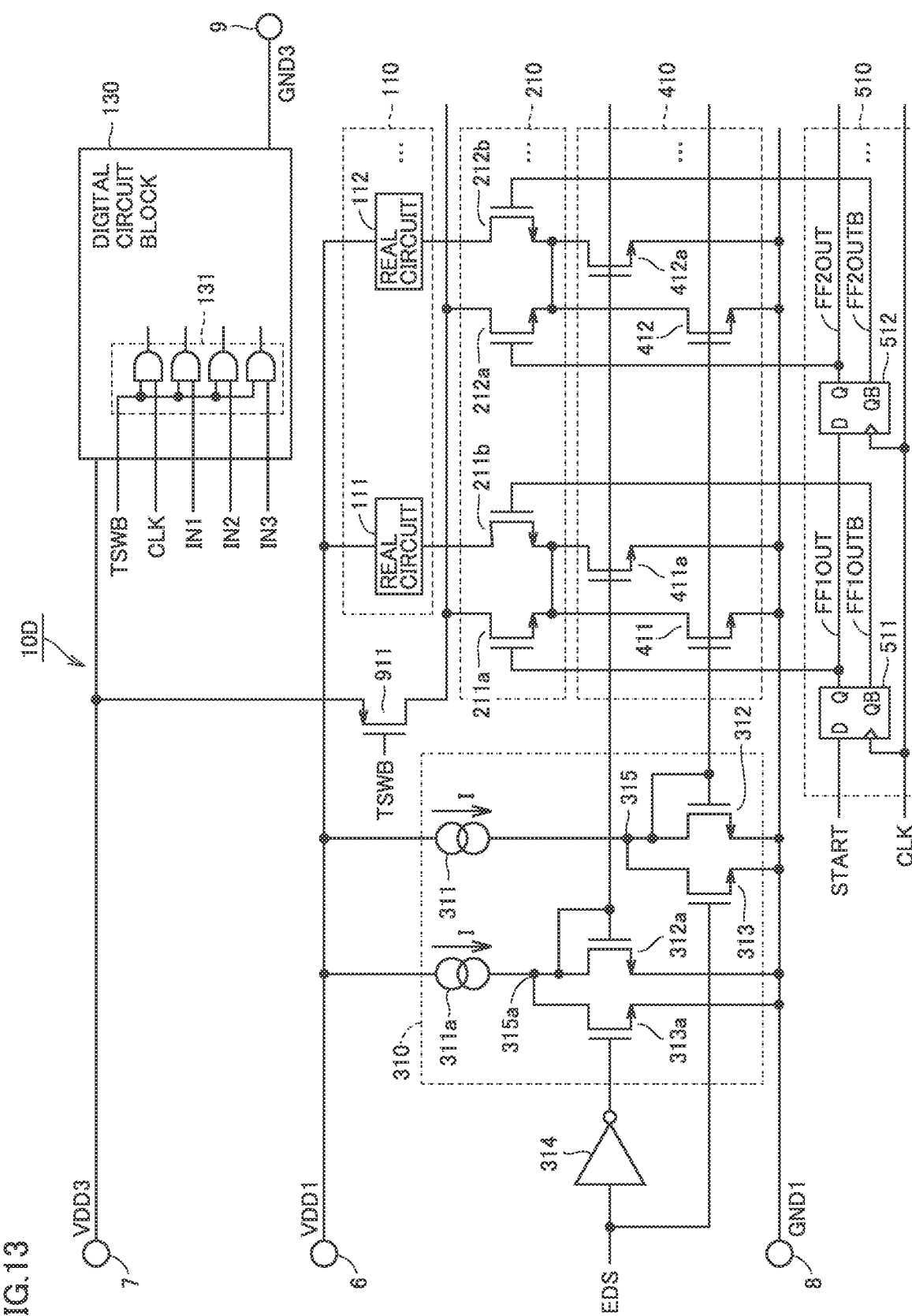
FIG. 13 is a circuit diagram illustrating a configuration example of a semiconductor integrated circuit according to a fourth embodiment.

FIG. 13 is a circuit diagram illustrating a configuration example of the semiconductor integrated circuit of the fourth embodiment. Semiconductor integrated circuit 10D in FIG. 13 is different from semiconductor integrated circuit 10C in FIG. 10 in the configurations of current source group 410 and current source control circuit 310. Semiconductor integrated circuit 10D in FIG. 13 is different from semiconductor integrated circuit 10C in FIG. 10 in that semiconductor integrated circuit 10D in FIG. 13 further includes an inverter 314 that receives error detection signal EDS.

Specifically, current source group 410 in FIG. 13 further includes NMOS transistors 411a, 412a, . . . connected in parallel to NMOS transistors 411, 412, . . . , respectively.

Current source control circuit 310 in FIG. 13 further includes a reference current source 311a and an NMOS transistor 312a in addition to reference current source 311 and NMOS transistor 312. Reference current source 311a and NMOS transistor 312a are connected in series to each other between power supply node 6 and ground node 8 and in parallel to the series connection circuit of reference current source 311 and NMOS transistor 312.

The gate of NMOS transistor 312 is connected to the drain thereof and connected to the gates of NMOS transistors 411, 412, . . . configuring current source group 410. Thus, NMOS transistors 312, 411, 412, . . . configure a current mirror. In addition, the gate of NMOS transistor 312a is connected to the drain of NMOS transistor 411a and the gates of NMOS transistors 412a, . . . added to the current source group 410. Thus, NMOS transistors 312a, 411a, 412a, . . . configure a current mirror.

Current source control circuit 310 in FIG. 13 further includes NMOS transistors 312, 312a connected in parallel to NMOS transistors 313, 313a, respectively. Error detection signal EDS is input to the gate of NMOS transistor 313. Error detection signal EDS in which a logical value is inverted by inverter 314 is input to the gate of NMOS transistor 313a.

Because other configurations in FIG. 13 are similar to those in FIG. 10, the same or corresponding portion is denoted by the same reference numeral, and the description thereof will not be repeated. The operation of semiconductor integrated circuit 10D will be described below.

In the initial state, because error detection signal EDS is in the inactive state (that is, the low level), NMOS transistor 313 is in the non-conductive state, and NMOS transistor 313a is in the conductive state. Accordingly, current I generated by reference current source 311 flows to NMOS transistor 312, and current I is copied and flows to NMOS transistors 411, 412, . . . configuring current source group 410. On the other hand, current I generated by the reference current source 311a flows through NMOS transistor 313a and does not flow through NMOS transistor 312a. Accordingly, current I also does not flow through NMOS transistors 411a, 412a, . . . configuring current source group 410.

On the other hand, when error detection signal EDS becomes the active state (that is, the high level), NMOS transistor 313 becomes the conductive state, and NMOS transistor 313a becomes the non-conductive state. Accordingly, current I generated by reference current source 311 flows to NMOS transistor 312a but does not flow to NMOS transistor 312. As a result, current I also does not flow through NMOS transistors 411, 412, . . . . On the other hand, current I generated by reference current source 311a flows to NMOS transistor 312a, and current I is copied and flows to NMOS transistors 411a, 412a, . . . configuring current source group 410.

Advantageous Effect of Fourth Embodiment

As described above, according to semiconductor integrated circuit 10D in FIG. 13, the current flows through only either of the plurality of first current sources 411, 412, . . . and the plurality of second current sources 411a, 412a, . . . configuring current source group 410 selected according to error detection signal EDS. As a result, when it is detected that the failure is generated in any one of the plurality of first current sources 411, 412, . . . used in the initial state, the current source to be used is switched to the plurality of second current sources 411a, 412a, . . . . As a result, semiconductor integrated circuit 10D can be continuously used. The current measurement for error detection of current source 40 is desirably performed at the time of the power activation or standby of semiconductor integrated circuit 10D.

Fifth Embodiment

In a semiconductor integrated circuit 10E according to a fifth embodiment, the case in which a plurality of spare current sources are provided in current source group 410 and a failed current source is individually switched to a spare current source will be described. Although the case where analog circuit block 110 and digital circuit block 130 are provided in semiconductor integrated circuit 10E will be described below, the technique of the fifth embodiment can be similarly applied to the case where the plurality of analog circuit blocks are provided in the semiconductor integrated circuit.

[Current Measurement Circuit]

Figure 14:
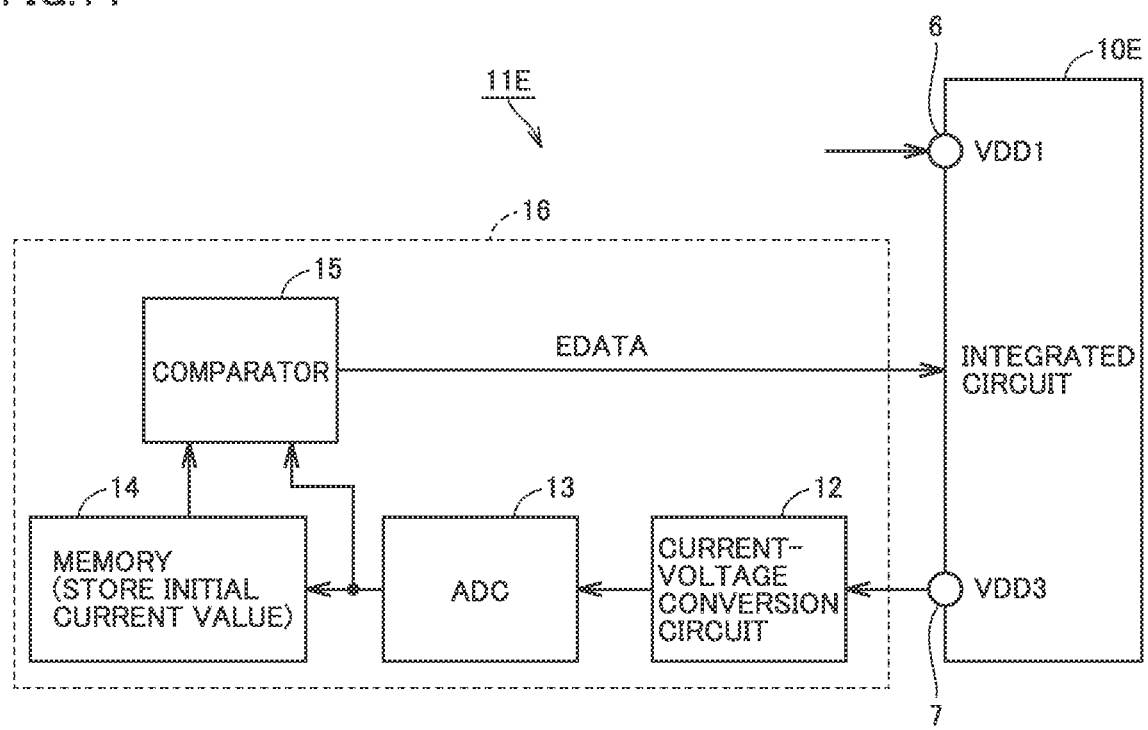
FIG. 14 is a circuit diagram illustrating a configuration example of a current measurement circuit connected to a power supply node of a semiconductor integrated circuit in a semiconductor device of a fifth embodiment.

FIG. 14 is a circuit diagram illustrating a configuration example of the current measurement circuit connected to the power supply node of the semiconductor integrated circuit in a semiconductor device of the fifth embodiment. Although FIG. 14 illustrates an example in which a semiconductor device 11E includes semiconductor integrated circuit 10E and separate current measurement circuit 16, current measurement circuit 16 may be included in semiconductor integrated circuit 10E.

Current measurement circuit 16 in FIG. 14 is different from current measurement circuit 16 in FIG. 12 in that comparator 15 outputs error data EDATA indicating an error determination result for each current source NMOS transistor instead of binary error detection signal EDS. Because the other points in FIG. 14 are similar to those in FIG. 12, the same or corresponding portion is denoted by the same reference numeral, and the description thereof may not be repeated.

Figure 15:
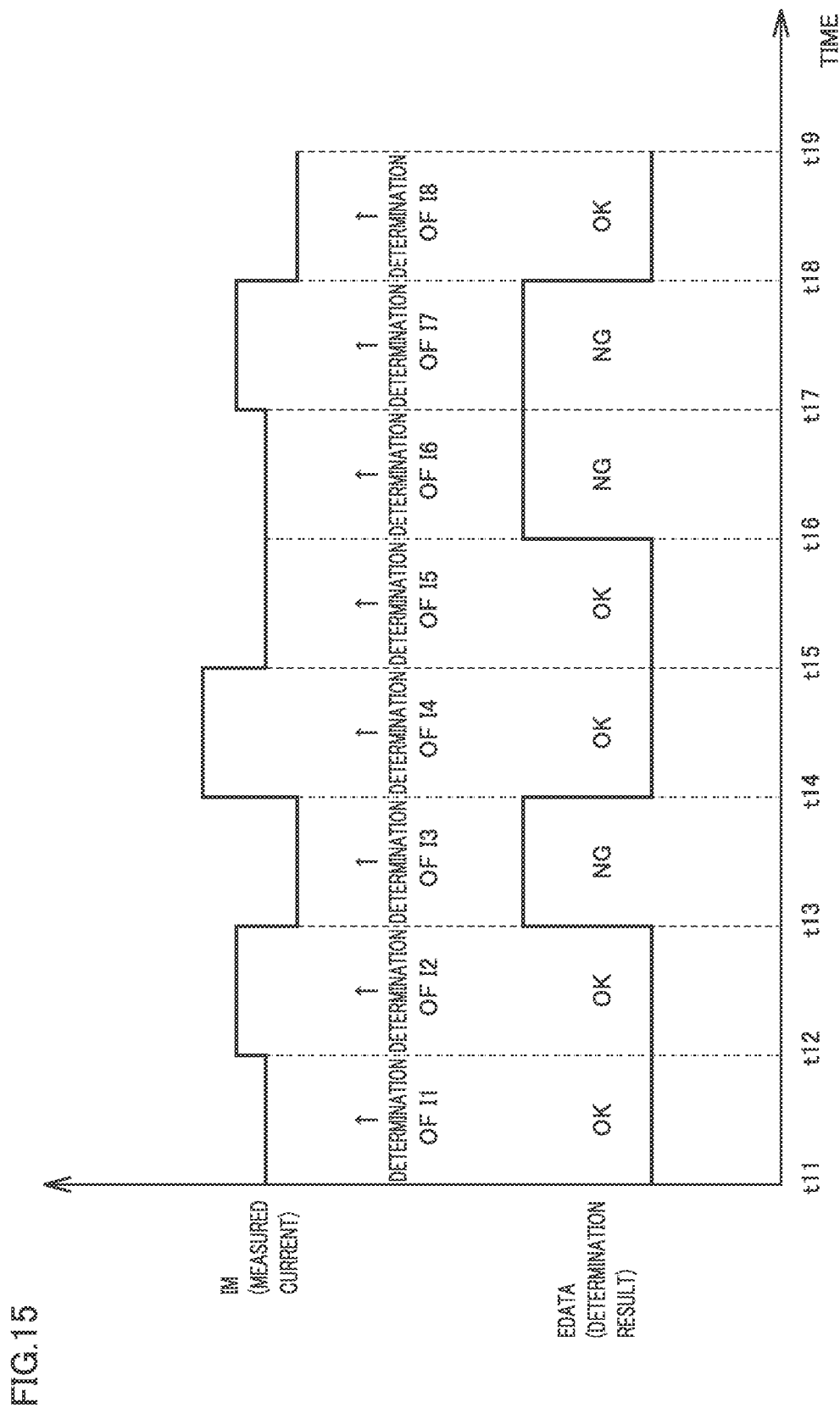
FIG. 15 is a view illustrating error data in FIG. 14.

FIG. 15 is a view illustrating the error data in FIG. 14. With reference to FIG. 15, between time t11 and time t12, a measured current I1 for first current source 40 configuring current source group 410 is detected by current measurement circuit 16 through power supply node 7. It is assumed that the quality determination result by comparator 15 is OK (low level, "0"). The appropriate range of the current value of current source 40 differs for each current source 40.

Between next time t12 and time t13, a measured current I2 for second current source 40 configuring current source group 410 is detected by current measurement circuit 16 through power supply node 7. It is assumed that the quality determination result by comparator 15 is OK (low level, "0").

Between next time t13 and time t14, a measured current I3 for third current source 40 configuring current source group 410 is detected by current measurement circuit 16 through power supply node 7. It is assumed that the quality determination result by comparator 15 is NG (high level, "1").

Similarly, from time t14 to time t19, measured currents I4 to I8 for fourth to eighth current sources 40 configuring current source group 410 are sequentially detected through power supply node 7. Error data EDATA in this case is data "00100110" indicating the first to eighth determination results.

[Configuration and Operation of Semiconductor Integrated Circuit]

Figure 16:
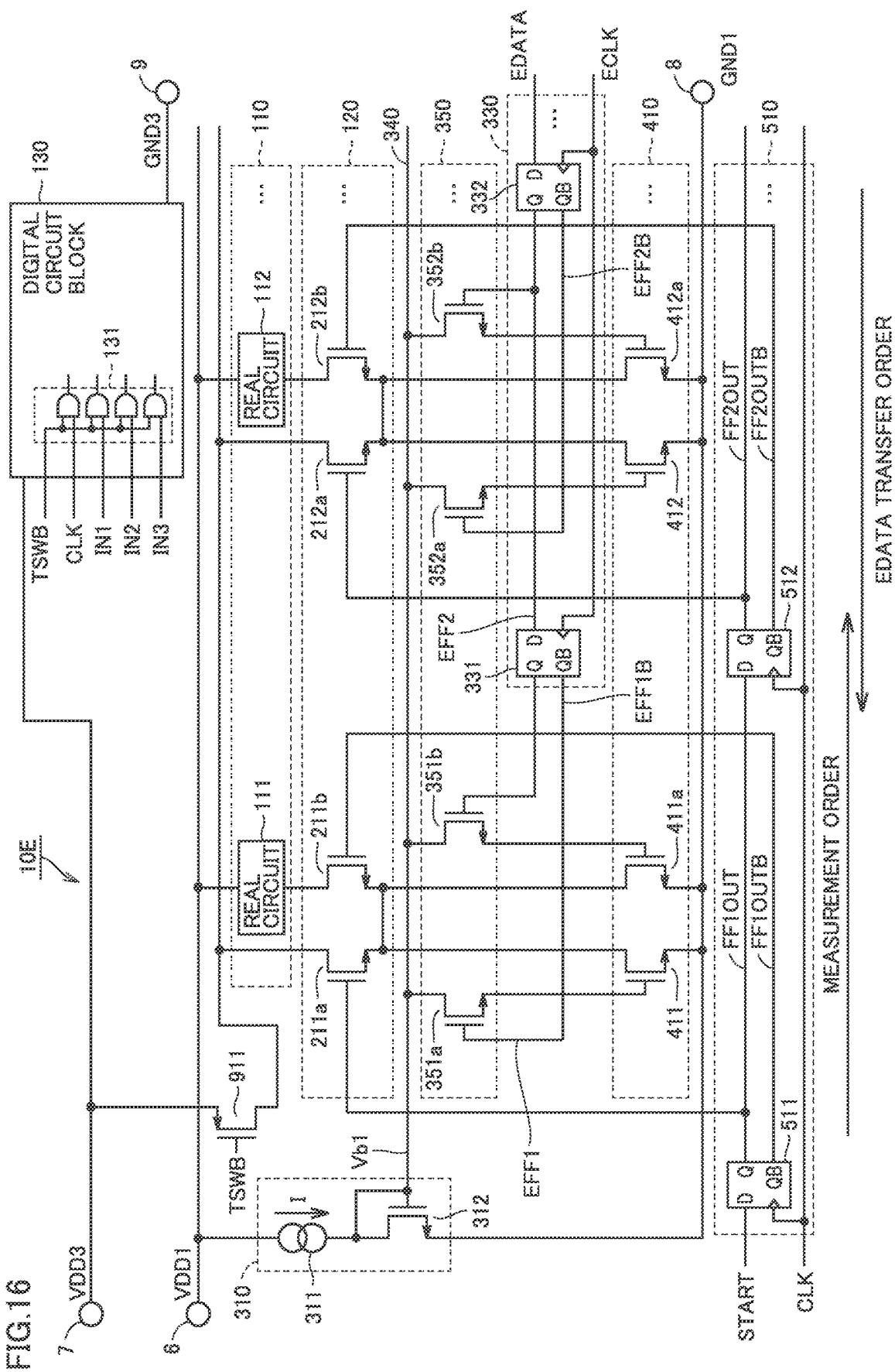
FIG. 16 is a circuit diagram illustrating a configuration example of a semiconductor integrated circuit 10 of the fifth embodiment.

FIG. 16 is a circuit diagram illustrating a configuration example of semiconductor integrated circuit 10 of the fifth embodiment. Semiconductor integrated circuit 10E in FIG. 16 is different from semiconductor integrated circuit 10C in FIG. 10 in the configuration of current source group 410. Furthermore, semiconductor integrated circuit 10E in FIG. 16 is different from semiconductor integrated circuit 10C in FIG. 10 in that semiconductor integrated circuit 10E in FIG. 16 further includes a switch group 350 and an sequential circuit 330 that controls switch group 350.

Specifically, current source group 410 in FIG. 16 further includes NMOS transistors 411a, 412a, . . . connected in parallel to NMOS transistors 411, 412, . . . , respectively.

Switch group 350 includes switching NMOS transistors 351a, 352a, . . . connected between the gates of NMOS transistors 411, 412, . . . configuring current source group 410 and a control line 340 that supplies bias voltage Vb1 from current source control circuit 310. Switch group 350 further includes switching NMOS transistors 351b, 352b, . . . connected between the gates of NMOS transistors 411a, 412a, . . . configuring current source group 410 and control line 340.

Sequential circuit 330 includes D flip-flops 331, 332, . . . connected in cascade, and has the same configuration as a shift register. A clock signal ECLK is input to the CLK terminal of D flip-flops 331, 332, . . . . D flip-flops 331, 332, . . . correspond to NMOS transistors 411, 412, . . . configuring current source group 410, and the data transfer direction is opposite to the data transfer direction of D flip-flops 511, 512, . . . of sequential circuit 510.

More specifically, N D flip-flops from the first to the Nth corresponding respectively to the N current source NMOS transistors from the first to the Nth are provided in sequential circuit 330. The N D flip-flops are cascade-connected in reverse order. That is, the output terminal (Q terminal) of the (i+1)-th (1≤i≤N-1) D flip-flop is connected to the input terminal (D terminal) of the i-th D flip-flop. The N spare current source NMOS transistors are connected in parallel to the N regular current source NMOS transistors, respectively. Furthermore, a first switching NMOS transistor is connected between the gate of the regular current source NMOS transistor and control line 340 for supplying bias voltage Vb1. A second switching NMOS transistor is connected between the gate of the spare current source NMOS transistor and control line 340. The Q terminal of each of the N D flip-flops is connected to the gate of the second switching NMOS transistor that is connected to a corresponding one of the spare current source NMOS transistors. An inverting output terminal (QB terminal) of each of the N D flip-flops is connected to the gate of the first switching NMOS transistor that is connected to a corresponding one of the regular current source NMOS transistors.

In sequential circuit 5 having the above configuration, the error determination results of the current source NMOS transistors are input to the D terminal of the Nth D flip-flop in the order from the first to the Nth, and sequentially transferred by the N-pulse clock signal ECLK. Thus, the error determination results of the first to Nth current source NMOS transistors are held in the first to Nth D flip-flops. When a j-th (1≤j≤N) D flip-flop is in the reset state (that is, the corresponding regular current source is normal), the corresponding first switching NMOS transistor is in the conductive state, and the corresponding second switching NMOS transistor is in the non-conductive state. Thus, the gate of the j-th regular current source NMOS transistor and control line 340 are brought into conduction, so that the j-th regular NMOS transistor is used as a current source. On the other hand, when the j-th (1≤j≤N) D flip-flop is in the set state (that is, the corresponding regular current source is abnormal), the corresponding first switching NMOS transistor is brought into the non-conductive state, and the corresponding second switching NMOS transistor is brought into the conductive state. Thus, the gate of the j-th spare current source NMOS transistor and control line 340 are brought into conduction, so that the j-th spare NMOS transistor is used as a current source.

In the case of FIG. 16, first D flip-flop 331 is provided to control switching NMOS transistors 351a, 351b between the gates of current source NMOS transistors 411, 411a and control line 340. Specifically, the Q terminal of D flip-flop 331 is connected to the gate of NMOS transistor 351b. The QB terminal of D flip-flop 331 is connected to the gate of NMOS transistor 351a.

Second D flip-flop 332 is provided to control switching NMOS transistors 352a, 352b between the gates of current source NMOS transistors 412, 412a and control line 340. Specifically, the Q terminal of D flip-flop 332 is connected to the gate of NMOS transistor 352b. The QB terminal of D flip-flop 332 is connected to the gate of NMOS transistor 352a.

Furthermore, the Q terminal of second D flip-flop 332 is connected to the D terminal of adjacent first D flip-flop 331. As described above, D flip-flops 331, 332, . . . are connected in series in the reverse order, whereby D flip-flops 331, 332, . . . function as shift registers.

FIG. 17 is a timing chart illustrating a procedure for transferring error data to the D flip-flop configuring the second switch group in FIG. 16. FIG. 17 illustrates the procedure for storing error data EDATA indicating the error determination result in FIG. 15 in D flip-flops 331, 332, . . . configuring sequential circuit 330. FIG. 17 illustrates the case where sequential circuit 330 includes eight D flip-flops.

With reference to FIG. 17, error data EDATA is input to the D terminal of the eighth D flip-flop at the falling edges of eight clock signals ECLK from time t31 to time t38. Error data EDATA is sequentially transferred in reverse order towards first D flip-flop 331 according to the eight falling edges of clock signal ECLK3. FIG. 17 illustrates output signals EFF1 to EFF8 of the Q terminals of eight D flip-flops from first D flip-flop 331 to the eighth D flip-flop.

For example, at time t33 that is the falling edge of the third clock signal, the error determination result ("1") for the third current source NMOS transistor is input to the D terminal of the eighth D flip-flop. This error determination result is transferred to the third D flip-flop by five transfer pulses (clock signal ECLK) from time t34 to time t38. Thus, output signal EFF3 of the Q terminal of the third D flip-flop finally becomes the high level.

Advantageous Effect of Fifth Embodiment

As described above, according to semiconductor integrated circuit 10E of the fifth embodiment, only the failed current source transistor is replaced with the spare current source transistor. Accordingly, the fault tolerance performance of semiconductor integrated circuit 10E can be enhanced as compared with semiconductor integrated circuit 10D of the fourth embodiment that cannot be used when any two current source transistors fail.

It should be understood that the embodiments disclosed herein are illustrative and non-restrictive in every respect. The scope of the present application is shown not in the description above, but in the claims, and it is intended that all modifications that come within the meaning and range of equivalence to the claims are included here.

REFERENCE SIGNS LIST 1, 110, 120: analog circuit block, 2, 210, 220, 350: switch group, 3, 310, 320: current source control circuit, 4, 410, 420: current source group, 5, 330, 510, 520: sequential circuit, 6, 7: power supply node, 8, 9: ground node, 10, 10A to 10E: semiconductor integrated circuit, 11E, 11F: semiconductor device, 12: voltage conversion circuit, 13: analog-to-digital converter, 14: memory, 15: comparator, 16: current measurement circuit, 40: current source, 40a: first end, 40b: second end, 130: digital circuit block, 131: input interface, 301, 301b, 311, 311a: reference current source, 314:

inverter, 317, 327: constant voltage source, 331, 332, 501, 502, 503, 511, 512, 513: flip-flop, 340: control line, 910, 920: test mode switch

The invention claimed is:

1. A semiconductor integrated circuit comprising:
a first node;
a second node;
a third node;
a first analog circuit block to operate by a voltage applied between the first node and the third node;
a plurality of first current sources each having a first end connected to the third node and a second end connected to the first analog circuit block, to function as current sourcing or current sinking for the first analog circuit block; and
a first switch group to be provided between the plurality of first current sources and the first analog circuit block, and in a test mode, to individually switch electrical connection of the second end of each of the plurality of first current sources from the first analog circuit block to the second node such that an electric current generated by each first current source flows through the second node instead of through the first analog circuit block.

2. The semiconductor integrated circuit according to claim 1, further comprising a first sequential circuit,
wherein in the test mode, the first sequential circuit controls the first switch group to sequentially switch the electrical connection of the second end of each of the plurality of first current sources one by one in order of the first analog circuit block, the second node, and the first analog circuit block.

3. The semiconductor integrated circuit according to claim 2, wherein
the first sequential circuit includes a plurality of first flip-flops connected in cascade and each provided for a corresponding one of the plurality of first current sources, and
each of the plurality of first flip-flops has a first state and a second state as internal states, controls the first switch group to electrically connect the second end of the corresponding first current source to the first analog circuit block in the first state, and controls the first switch group to electrically connect the second end of the corresponding first current source to the second node in the second state.

4. The semiconductor integrated circuit according to claim 1, further comprising:
a fourth node;
a second analog circuit block to operate by a voltage applied between the second node and the fourth node; and
a plurality of second current sources each having a first end connected to the fourth node and a second end connected to the second analog circuit block, to function as current sourcing or current sinking for the second analog circuit block.

5. The semiconductor integrated circuit according to claim 4, further comprising a first current source control circuit to set to zero or reduce current flowing from the plurality of second current sources in the test mode.

6. The semiconductor integrated circuit according to claim 5, wherein
the first current source control circuit includes:
a first reference current source; and
a first reference transistor through which current generated by the first reference current source flows,
each of the plurality of second current sources includes a transistor configuring a current mirror with the first reference transistor, and
the first current source control circuit sets to zero or reduces the current flowing through the first reference transistor in the test mode.

7. The semiconductor integrated circuit according to claim 1, further comprising:
a fourth node; and
a digital circuit block to operate by a voltage applied between the second node and the fourth node.

8. The semiconductor integrated circuit according to claim 7, wherein the digital circuit block includes an input interface to stop circuit operation by fixing logic levels of a plurality of input digital signals in the test mode.

9. The semiconductor integrated circuit according to claim 1, further comprising:
a plurality of third current sources each being provided for a corresponding one of the plurality of first current sources and each being connected in parallel to the corresponding first current source; and
a second current source control circuit to control the plurality of first current sources and the plurality of third current sources.

10. The semiconductor integrated circuit according to claim 9, wherein the second current source control circuit is configured to switch between: a state in which the plurality of first current sources are operated and the plurality of third current sources are stopped; and a state in which the plurality of first current sources are stopped and the plurality of third current sources are operated.

11. The semiconductor integrated circuit according to claim 10, wherein
the second current source control circuit includes:
a second reference current source;
a second reference transistor through which current generated by the second reference current source flows;
a third reference current source; and
a third reference transistor through which current generated by the third reference current source flows,
each of the plurality of first current sources includes a first transistor configuring a current mirror with the second reference transistor,
each of the plurality of third current sources includes a second transistor configuring a current mirror with the third reference transistor, and
the second current source control circuit is configured to set to zero the current flowing through either the second reference transistor or the third reference transistor.

12. The semiconductor integrated circuit according to claim 9, wherein the second current source control circuit is configured to switch an operation state of each of the plurality of first current sources and the plurality of third current sources such that one of the first current source and the third current source which correspond to each other is operated and the other is stopped.

13. The semiconductor integrated circuit according to claim 12, wherein
the second current source control circuit includes:
a second reference current source;
a diode-connected second reference transistor through which current generated by the second reference current source flows; and
a control line connected to a control electrode of the second reference transistor, each of the plurality of first current sources includes a first transistor connected between the first end and the second end, each of the plurality of third current sources includes a second transistor connected in parallel to the first transistor of the corresponding first current source, the semiconductor integrated circuit further includes a second switch group provided between a control electrode of the first transistor configuring each of the plurality of first current sources, a control electrode of the second transistor configuring each of the plurality of third current sources, and the control line, and the second switch group electrically connects, to the control line, the control electrode of either the first transistor of the first current source or the second transistor of the third current source which correspond to each other.

14. The semiconductor integrated circuit according to claim 13, further comprising a second sequential circuit to control the second switch group, wherein the second sequential circuit includes a plurality of second flip-flops connected in cascade and each provided for a corresponding one of the plurality of first current sources, and each of the plurality of second flip-flops has a first state and a second state as internal states, controls the second switch group to electrically connect the control electrode of the first transistor configuring the corresponding first current source to the control line in the first state, and controls the second switch group to electrically connect the control electrode of the second transistor configuring a third current source connected in parallel to the corresponding first current source to the control line in the second state.

15. A semiconductor device comprising:
a semiconductor integrated circuit including:
 a first node;
 a second node;
 a third node;
 a first analog circuit block to operate by a voltage applied between the first node and the third node;
 a plurality of first current sources each having a first end connected to the third node and a second end connected to the first analog circuit block, to function as current sourcing or current sinking for the first analog circuit block; and
 a first switch group to be provided between the plurality of first current sources and the first analog circuit block, and in a test mode, to individually switch electrical connection of the second end of each of the plurality of first current sources from the first analog circuit block to the second node such that an electric current generated by each first current source flows through the second node instead of through the first analog circuit block; and
a current measurement circuit connected to the second node, wherein
the current measurement circuit includes:
 a current-voltage conversion circuit connected to the second node to convert current flowing out from the second node or flowing into the second node into a voltage;
 an analog-to-digital converter to convert a conversion voltage generated by the conversion of the current-voltage conversion circuit into a digital value; and
 a comparator to compare the digital conversion voltage output from the analog-to-digital converter with a reference value.

* * * * *